US012273634B2

United States Patent
Nakata et al.

(10) Patent No.: US 12,273,634 B2
(45) Date of Patent: Apr. 8, 2025

(54) IMAGING ELEMENT AND ELECTRONIC APPARATUS

(71) Applicant: Sony Semiconductor Solutions Corporation, Kanagawa (JP)

(72) Inventors: Masashi Nakata, Kanagawa (JP); Hiroaki Yamajo, Kanagawa (JP); Yosuke Yamamoto, Tokyo (JP); Yuichiro Baba, Kanagawa (JP); Junichi Kanai, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/908,196

(22) PCT Filed: Mar. 1, 2021

(86) PCT No.: PCT/JP2021/007777
§ 371 (c)(1),
(2) Date: Aug. 30, 2022

(87) PCT Pub. No.: WO2021/187076
PCT Pub. Date: Sep. 23, 2021

(65) Prior Publication Data
US 2023/0140768 A1   May 4, 2023

Related U.S. Application Data

(60) Provisional application No. 63/054,919, filed on Jul. 22, 2020, provisional application No. 62/990,303, filed on Mar. 16, 2020.

(51) Int. Cl.
*H04N 25/13* (2023.01)
*G06V 10/143* (2022.01)
(Continued)

(52) U.S. Cl.
CPC ......... *H04N 25/136* (2023.01); *G06V 10/143* (2022.01); *H04N 23/11* (2023.01);
(Continued)

(58) Field of Classification Search
CPC ...... H04N 25/136; H04N 23/11; H04N 23/12; H04N 23/611; H04N 23/667; H04N 25/534; G06V 10/143; H10K 39/32
See application file for complete search history.

(56) References Cited

U.S. PATENT DOCUMENTS 4,245,241 A * 1/1981 Sato ................. H01L 27/14645
348/E9.01
7,057,654 B2 * 6/2006 Roddy ................ H04N 23/125
348/277
(Continued)

FOREIGN PATENT DOCUMENTS

EP 1729524 A1 12/2016
JP 2005-328421 A 11/2005
(Continued)

OTHER PUBLICATIONS

International Search Report (PCT/ISA/210), International Application No. PCT/JP2021/007777, dated Apr. 27, 2021.
(Continued)

*Primary Examiner* — Timothy J Henn
(74) *Attorney, Agent, or Firm* — Michael Best & Friedrich LLP

(57) ABSTRACT

Color accuracy in an imaging device is improved.
An imaging element includes a plurality of pixels that acquires first information that is information of three primary colors and second information that is information of at least two colors different from the three primary colors and that includes at least one of complementary colors of the three primary colors.

15 Claims, 29 Drawing Sheets

(51) Int. Cl.
*H04N 23/11* (2023.01)
*H04N 23/12* (2023.01)
*H04N 23/611* (2023.01)
*H04N 23/667* (2023.01)
*H04N 25/534* (2023.01)
*H10K 39/32* (2023.01)

(52) U.S. Cl.
CPC .......... *H04N 23/12* (2023.01); *H04N 23/611* (2023.01); *H04N 23/667* (2023.01); *H04N 25/534* (2023.01); *H10K 39/32* (2023.02)

(56) References Cited

U.S. PATENT DOCUMENTS

| | | | | |
|---|---|---|---|---|
| 7,663,685 | B2* | 2/2010 | Inuiya | H01L 27/14621 348/280 |
| 2006/0038953 | A1* | 2/2006 | Moriya | H10K 59/38 349/144 |
| 2007/0285540 | A1* | 12/2007 | Kwon | H04N 25/131 348/E9.01 |
| 2008/0283729 | A1* | 11/2008 | Hosaka | H04N 25/135 348/E9.01 |
| 2009/0213251 | A1* | 8/2009 | Mizukura | H04N 25/135 348/278 |
| 2010/0141771 | A1* | 6/2010 | Hu | H04N 25/131 438/66 |
| 2013/0153748 | A1* | 6/2013 | Suzuki | H04N 25/136 250/208.1 |
| 2014/0072214 | A1* | 3/2014 | Tanaka | H04N 23/843 382/165 |
| 2015/0138366 | A1* | 5/2015 | Keelan | H04N 25/135 348/164 |
| 2016/0240573 | A1* | 8/2016 | Yamamoto | G02B 5/201 |
| 2017/0134704 | A1* | 5/2017 | Otsubo | G02B 5/20 |
| 2017/0163954 | A1* | 6/2017 | Sato | G06V 10/60 |
| 2018/0054578 | A1* | 2/2018 | Kitamori | H04N 25/778 |
| 2018/0227550 | A1* | 8/2018 | Fossum | H04N 25/133 |
| 2020/0374493 | A1* | 11/2020 | Jang | H04N 23/88 |

FOREIGN PATENT DOCUMENTS

| | | |
|---|---|---|
| JP | 2007-88873 A | 4/2007 |
| JP | 2009-60675 A | 3/2009 |
| JP | 2012-239038 A | 12/2012 |
| JP | 2013-045917 A | 3/2013 |
| JP | 2016-163306 A | 9/2016 |
| JP | 2017-59739 A | 3/2017 |
| JP | 2018-67915 A | 4/2018 |
| KR | 20190051371 A | 5/2019 |
| WO | 2014/007282 A1 | 1/2014 |
| WO | 2017/154444 A1 | 9/2017 |
| WO | 2017/159130 A | 9/2017 |
| WO | WO-2019088407 A1 | 5/2019 |

OTHER PUBLICATIONS

US Non Final Office Action dated Aug. 15, 2024 for U.S. Appl. No. 17/908,196.

* cited by examiner

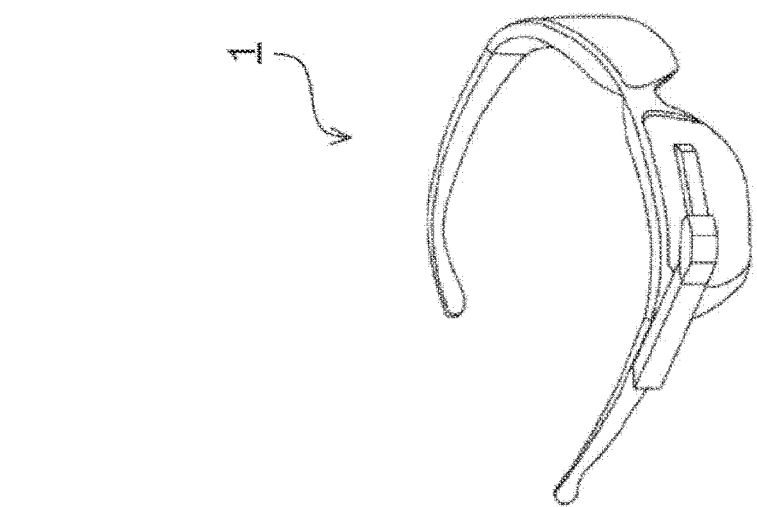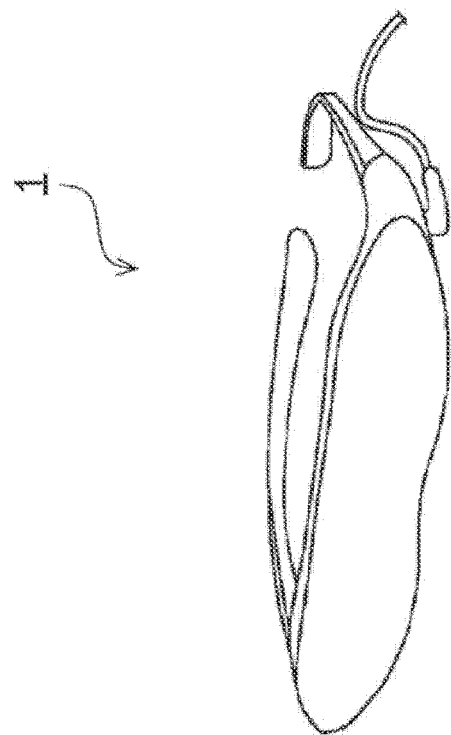
FIG. 30

IMAGING ELEMENT AND ELECTRONIC APPARATUS

TECHNICAL FIELD

The present disclosure relates to an imaging element and an electronic apparatus.

BACKGROUND ART

In a device including a solid-state imaging module, a method of using color filters of three colors as an imaging element is common. In recent years, a method of arranging different color filters in addition to color filters of three colors, for example, RGB, has been widely developed. In such an arrangement of the color filters, it is hard to say that sufficient good arrangements have been found from the viewpoint of image configuration.

Electronic apparatuses such as smartphones have been developed, and images are frequently shared on a social networking service (SNS) or the like. When an image is shared as described above, not only faithful color reproducibility but also color performance and the like are required, and it is desired to increase the degree of freedom of color adjustment or to change color production according to an object recognition result.

In a device such as a smartphone, for example, an under display camera (UDC) in which a camera is provided under a surface of a display has been developed. However, in such a configuration, since the camera receives light transmitted through the display, there is a problem that blue sensitivity is significantly reduced due to a material used. Furthermore, as one of problems of an organic photoelectric conversion film, when RGB is to be extracted in the vertical direction from one pixel, it is necessary to form the organic photoelectric conversion film or a photodiode into a two-layer structure, and thus there is a problem that the organic photoelectric conversion film or the photodiode is inefficient also in terms of cost and the like.

CITATION LIST

Patent Document

Patent Document 1: Japanese Patent Application Laid-Open No. 2013-045917

SUMMARY OF THE INVENTION

Problems to be Solved by the Invention

Embodiments of the present disclosure provide an imaging element and an electronic apparatus that include color filters of different colors in addition to color filters of three colors (for example, RGB) to improve the accuracy of image reconstruction.

Solutions to Problems

According to an embodiment, an imaging element includes a plurality of pixels that acquires first information that is information of three primary colors and second information that is information of at least two colors different from the three primary colors and that includes at least one of complementary colors of the three primary colors.

The three primary colors may be red (R), green (G), and blue (B), and the complementary colors may be cyan (Cy), yellow (Ye), and magenta (Mg).

The second information may include Cy information and Ye information.

The second information may include Cy information, Ye information, and Mg information.

The second information may include at least one of white information or emerald information.

The pixel may output information of at least two colors of the first information and the second information.

The pixel may include a plurality of divided pixels, and acquire information of one color of the first information and the second information for each of the divided pixels.

Pieces of information of similar colors among pieces of information of colors included in the first information and the second information may be collectively acquired.

The pieces of information of similar colors may include information of at least one of R and Mg, B and Cy, G and Ye, R and Ye, or R and infrared light.

The first information and the second information may be information acquired by different light receiving elements at the same timing.

The second information may include at least one of pieces of information of the three primary colors.

The first information and the second information may be acquired at different resolutions.

At least one of the pixels may acquire information by using an organic photoelectric conversion film.

The first information may be acquired in an organic photoelectric conversion film, and the second information may be acquired in a photodiode via the organic photoelectric conversion film, or the second information may be acquired in an organic photoelectric conversion film, and the first information may be acquired in a photodiode via the organic photoelectric conversion film.

An electronic apparatus may include any one of the imaging elements, in which the electronic apparatus may have a still image mode and a moving image mode, and combine the first information and the second information at different timings or in different blocks in the still image mode and the moving image mode.

At least one of the pixels may acquire information of light in an infrared region.

A filter capable of removing infrared rays may be provided in at least a part of an imaging element included in the pixel that acquires the information of light in the infrared region.

The frame images output from the pixels may be combined, and the number of pixels to be added for each frame may be controlled at a combining timing.

According to an embodiment, an electronic apparatus includes the above imaging element, in which the electronic apparatus performs object identification, living body identification, or light source estimation on the basis of spectrum information acquired from the imaging element.

Image processing or a parameter for the image processing may be controlled on the basis of a target identified through the object identification or the living body identification.

An electronic apparatus may include a display that displays an image; and any one of the above imaging elements provided at a position overlapping the display.

According to an embodiment, an electronic apparatus includes a compound-eye camera including at least one of the above imaging elements, in which at least one of the imaging elements does not include an infrared ray cut filter.

According to an embodiment, the imaging element may further include a first pixel group that acquires the first information and a second pixel group that acquires the second information, and the second pixel group may include a pixel having a sensitivity higher than a sensitivity of a pixel that acquires G information in the first pixel group.

The second pixel group may include at least pixels that acquire white information.

Information acquired by the second pixel group may be interpolated by using information acquired by the first pixel group.

The imaging element may have in a still image mode in which a still image is acquired and a moving image mode in which a moving image is acquired, and the first pixel group and the second pixel group may be combined according to different methods in the still image mode and the moving image mode.

The first pixel group and the second pixel group may be combined at different timings in the still image mode and the moving image mode.

The first pixel group and the second pixel group may be combined in different system blocks in the still image mode and the moving image mode.

A resolution of a pixel belonging to the first pixel group may be set to be lower than a resolution of a pixel belonging to the second pixel group in the moving image mode.

Color information acquired from the second pixel group may be corrected on the basis of a color information statistical value or a light source estimation result acquired from the first pixel group.

A pixel belonging to the first pixel group and a closest pixel among pixels belonging to the second pixel group are disposed to be separated by a distance of 10 mm or less.

The closest pixel may be disposed to be separated by a distance of 50 mm to 80 mm.

Either the first pixel group or the second pixel group may include divided pixels into which a pixel belonging to the first pixel group or the second pixel group may be divided.

The divided pixels may include a white pixel.

For light acquired in the first pixel group and the second pixel group, optical parameters serving as paths of the light may have different parameters in the respective groups.

The second pixel group may include a pixel having a sensitivity higher than a sensitivity of a pixel that acquires B information in the first pixel group.

The pixel having the sensitivity higher than the sensitivity of the pixel that acquires the B information may be a pixel that acquires white or cyan information.

For pixel information acquired in five or more colors, the imaging element may recalculate the information of the three primary colors through arithmetic processing from the acquired image information, and rearranged information may be output.

The imaging element may calculate a pixel value or a statistical value of information including at least complementary color information from the acquired image information.

The imaging element may calculate the statistical value of the information of the three primary colors and the complementary color information from the acquired image information.

The imaging element may calculate the statistical value from the complementary color information on the basis of the acquired image information without including the information of the three primary colors.

The imaging element may control respective exposure amounts of pixels receiving light of the three primary colors and pixels receiving light of the complementary colors.

The exposure amount may be controlled by controlling a shutter time.

The exposure amount may be controlled by controlling a gain.

According to an embodiment, a solid-state imaging device includes at least one imaging element among the imaging elements described above.

According to an embodiment, an electronic apparatus includes an imaging element including a plurality of pixels that acquires first information that is information of three primary colors and second information that is information of at least two colors different from the three primary colors and that includes at least one of complementary colors of the three primary colors.

BRIEF DESCRIPTION OF DRAWINGS

FIG. 30 is a schematic diagram illustrating an example of an electronic apparatus including the solid-state imaging device according to an embodiment.

MODE FOR CARRYING OUT THE INVENTION

Figure 1:
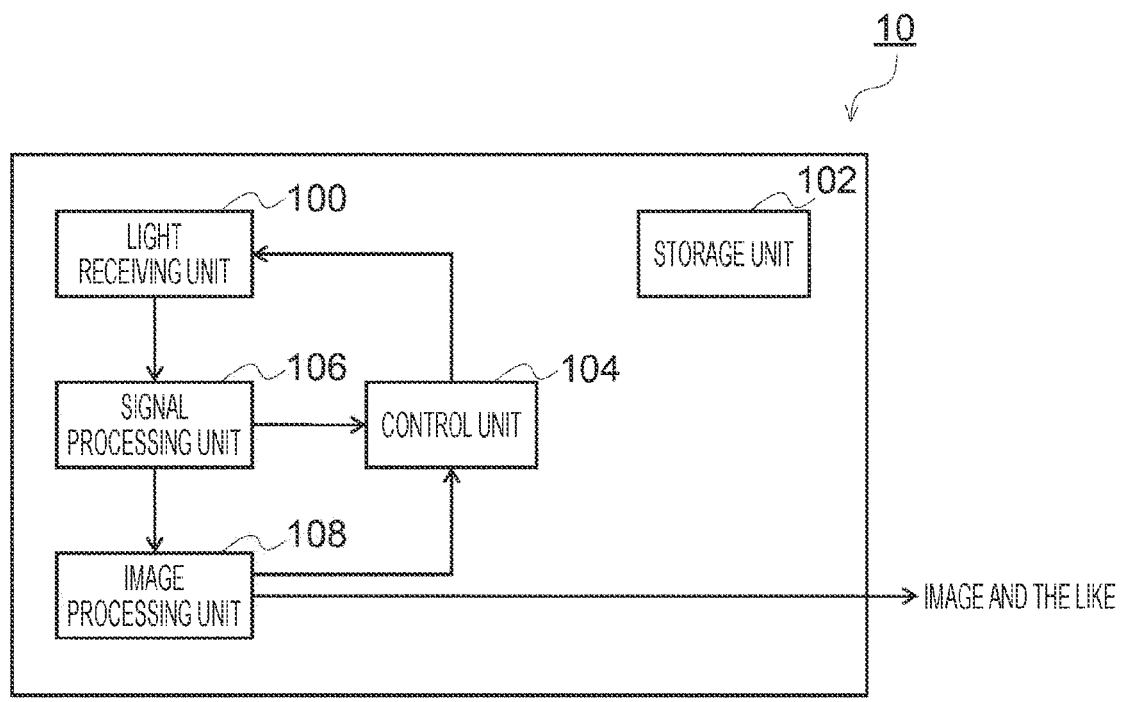
FIG. 1 is a diagram illustrating an example of a block diagram of a solid-state imaging device according to an embodiment.

Hereinafter, embodiments of the present disclosure will be described with reference to the drawings. The drawings are used for description, and a shape or a size of a constituent of each unit in an actual device, a ratio of the size to another constituent, and the like are not necessarily as illustrated in the drawings. Furthermore, since the drawings are illustrated in a simplified manner, configurations necessary for implementation other than those illustrated in the drawings may be appropriately provided.

FIG. 1 is a diagram illustrating an example of a block diagram of a solid-state imaging device according to an embodiment. A solid-state imaging device 10 includes a light receiving unit 100, a storage unit 102, a control unit 104, a signal processing unit 106, and an image processing unit 108. The solid-state imaging device 10 is a device that appropriately processes light received by the light receiving unit 100, converts the light into image information, recognition information, and the like, and outputs the image information, the recognition information, and the like.

The light receiving unit 100 receives light from the outside and outputs a signal based on the intensity of the received light.

The storage unit 102 stores data required in each constituent of the solid-state imaging device 10 or data output from each constituent. The storage unit 102 includes a memory, a storage, and the like which are any transitory or non-transitory appropriate storage media.

The control unit 104 controls the light receiving unit 100 and the like. For example, the control unit 104 may perform control on the basis of an input from a user, or may perform control on the basis of a preset condition. Furthermore, the control unit 104 may perform control based on outputs of the signal processing unit 106, the image processing unit 108, and the like.

The signal processing unit 106 appropriately processes and outputs the signal output from the light receiving unit 100. The signal processing unit 106 executes, for example, a process of converting an analog signal output from the light receiving unit 100 into a digital signal. In addition, a process such as a signal clamping process may be executed. As an example, the signal processing unit 106 converts the received analog signal into a digital image signal and outputs the image information to the image processing unit 108.

In the image processing unit 108, the signal processing unit 106 performs predetermined image processing on the converted information. The image processing unit 108 executes, for example, a noise removal process, various filtering processes, and the like, and appropriately processes the image information.

The signal processing unit 106 and the image processing unit 108 are described separately for convenience, but may be provided as one signal processing unit. As another example, the processing units may be configured by a finer unit (circuit) instead of two units (circuits) for each process. The signal processing unit 106 and/or the image processing unit 108 generate(s) information and images according to various purposes based on signals output from the imaging element.

Some or all of the respective units of the solid-state imaging device 10 described above may be implemented by a dedicated digital circuit or an analog circuit. In the case of a dedicated circuit, for example, an application specific integrated circuit (ASIC) or a field programmable gate array (FPGA) may be used. Furthermore, the units may be implemented by a general-purpose processing circuit such as a central processing unit (CPU).

Figure 2:
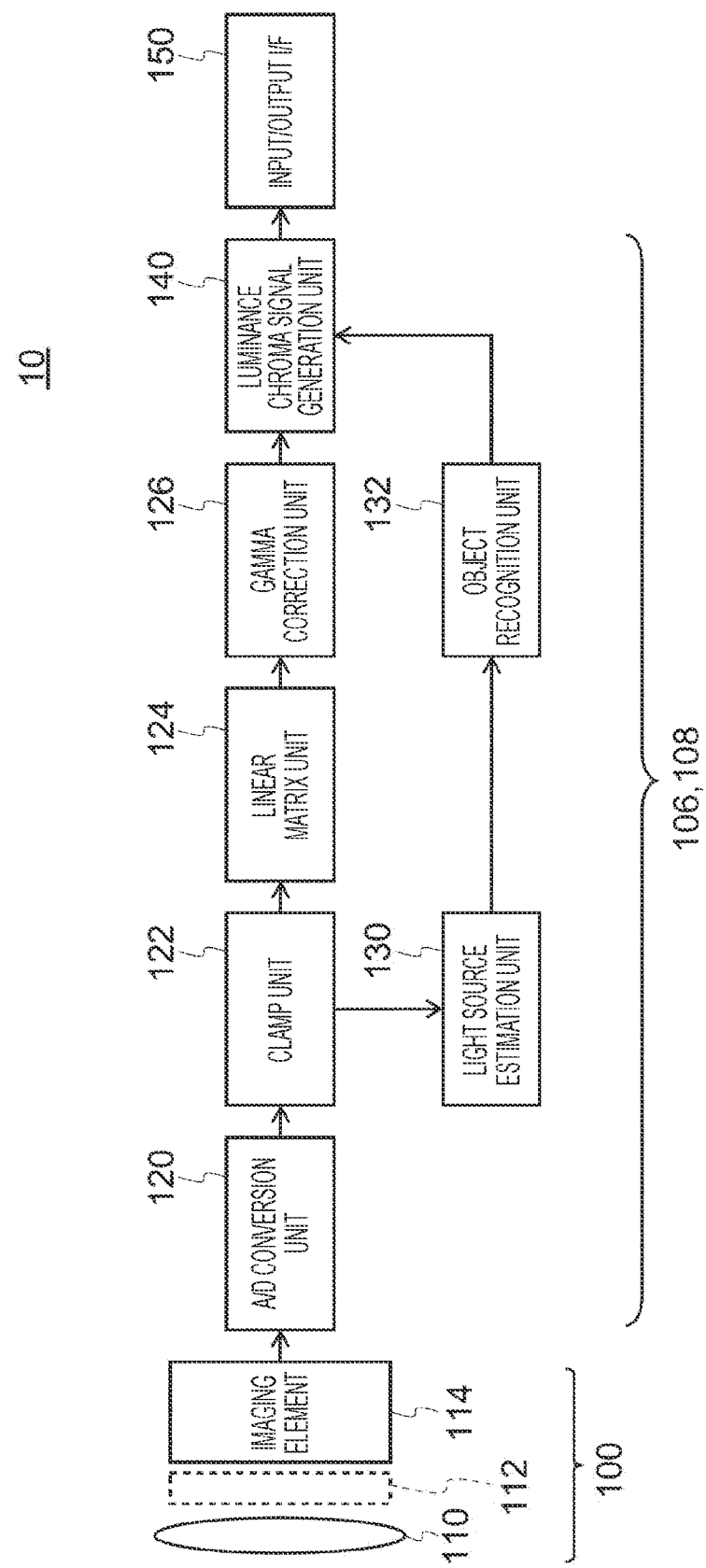
FIG. 2 is a diagram illustrating an example of a block diagram of the solid-state imaging device according to an embodiment.

FIG. 2 is a block diagram illustrating a more detailed non-limiting example of a configuration of the solid-state imaging device 10 illustrated in FIG. 1.

The light receiving unit 100 includes, for example, a lens 110, an infrared ray cut filter (IRCF 112), and an imaging element 114. Light appropriately refracted by the lens 110 enters the imaging element 114 via the IRCF 112, and an analog signal is output on the basis of an intensity of the light received by the imaging element 114. The IRCF 112 is not an essential configuration. Furthermore, an optical system other than the lens 110 may be provided.

The imaging element 114 includes, for example, an organic photoelectric conversion film or a photodiode. The imaging element 114 may be provided with a color filter in order for each imaging element 114 to acquire light with an appropriate spectrum. In a case where the imaging element 114 is an organic photoelectric conversion film, each imaging element 114 itself may output an analog signal based on the intensity of light with an appropriate spectrum instead of including a filter.

The signal processing unit 106 or the image processing unit 108 includes, for example, an A/D conversion unit 120, a clamp unit 122, a linear matrix unit 124, a gamma correction unit 126, a light source estimation unit 130, an object recognition unit 132, and a luminance chroma signal generation unit 140.

As described above, the functions of the signal processing unit 106 and the image processing unit 108 do not have to be clearly divided. For example, a unit such as the A/D conversion unit 120 that processes a signal itself may be the signal processing unit 106, and a unit such as the gamma correction unit 126 that performs a process related to an image may be the image processing unit 108.

FIG. 2 is a diagram illustrated as an example, and the signal processing unit 106 or the image processing unit 108 may execute further signal processing and image processing instead of executing only the illustrated processes. Conversely, not all the constituents illustrated in FIG. 2 are essential, and the constituents may be appropriately omitted on the basis of a process to be executed.

The A/D conversion unit 120 converts an analog signal output from the imaging element 114 into a digital signal and outputs the digital signal. Note that the A/D conversion unit 120 may be built in the imaging element.

The clamp unit 122 subtracts a black level from the digital signal output from the A/D conversion unit 120.

The linear matrix unit 124 reproduces a color of an imaged target by combining the digital signals output from the clamp unit 122 for each color.

The gamma correction unit 126 performs a gamma correction process on the digital signal output from the linear matrix unit 124.

On the other hand, the light source estimation unit 130 estimates a light source environment, a scene, and the like from multicolor color information that is a digital signal output from the clamp unit 122.

The object recognition unit 132 recognizes what a subject indicated by the digital signal is in the environment estimated by the light source estimation unit 130. For this recognition, for example, a trained neural network model may be used.

The luminance chroma signal generation unit 140 reconstructs an image on the basis of the image signal subjected to gamma correction by the gamma correction unit 126 and the recognition result output by the object recognition unit 132. For example, the color information may be operated on the basis of an object recognized by the object recognition unit 132 to generate an image having a color suitable for the recognized object.

The input/output I/F 150 outputs the image data generated by the luminance chroma signal generation unit 140 to the outside.

As described above, the image captured as the subject is appropriately processed and output. Here, an arrangement of colors of light received in the imaging element 114 will be described in detail below.

Figure 3:
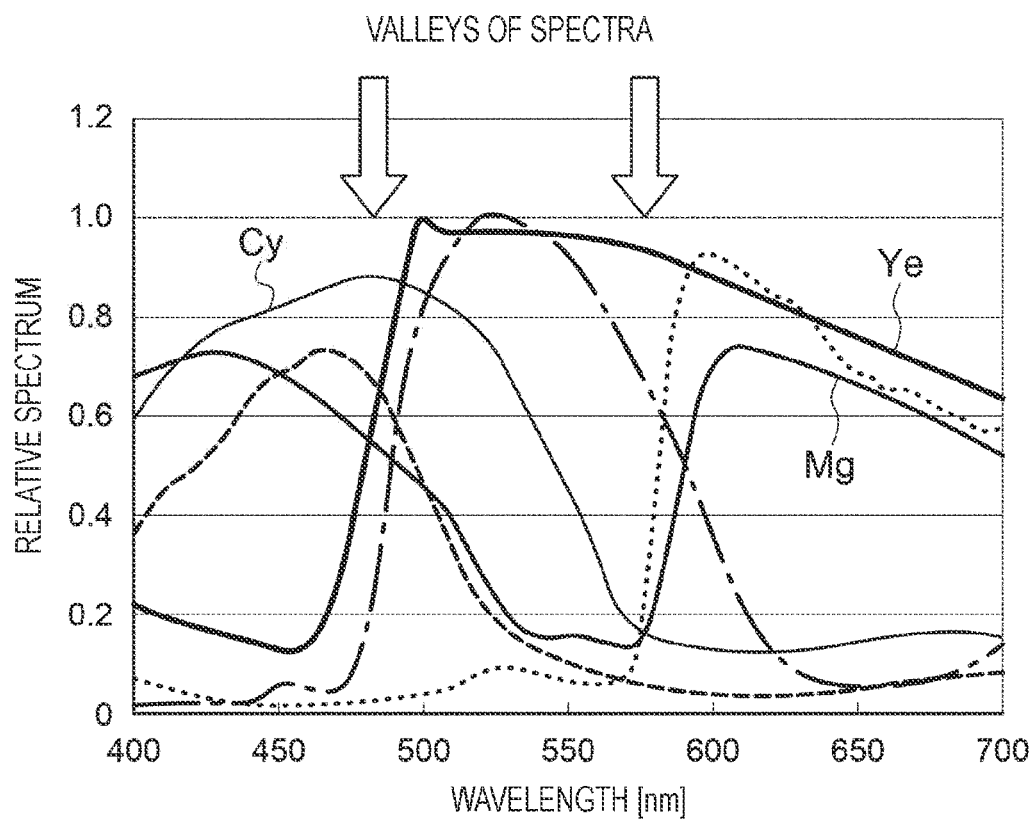
FIG. 3 is a diagram illustrating a relationship between a color and a spectrum.

FIG. 3 is a graph in which spectra of cyan (Cy), yellow (Ye), and magenta (Mg) are superimposed on a graph showing general spectra of red (R), green (G), and blue (B). As illustrated in FIG. 3, in the spectra of three colors of R (dotted line), G (one dot chain line), and B (dashed line), valleys of the spectra are present in the vicinity of wavelengths of 500 nm and 580 nm. That is, by performing addition by multiplying gains in the three colors, the light receiving property of a color in which a spectrum peak is present at this position is deteriorated.

In the present disclosure, in order to cope with such a valley of the spectrum, a color filter or an organic photoelectric conversion film is appropriately arranged to receive at least two pieces of light with intensities related to different spectral characteristics in addition to reception of light of three colors of R, G, and B. The characteristics of the spectrum indicated by the solid line represent spectra of cyan, yellow, and magenta as denoted by Cy, Ye, and Mg, respectively.

The solid-state imaging device 10 includes, for example, pixels that acquire first information that is a result of acquiring information of three primary colors of R, G, and B in the imaging element 114, and second information that is a result of acquiring information of at least two colors different from the three primary colors and that includes at least one color among Cy, Ye, and Mg that are complementary colors of the three primary colors. The three primary colors are not limited to RGB, but in the following description, RGB will be used as the three primary colors, and Cy, Ye, and Mg will be used as complementary colors.

As can be seen with reference to FIG. 3, when the color information acquired as the second information is Cy and Ye, the valleys of the spectra formed by RGB can be covered. Furthermore, as the second information, color information of Cy, Ye, and Mg, which are complementary colors of three colors, may be used. By adding Mg, finer color reproduction can also be achieved.

As described above, by using other spectra of the three primary colors, it is possible to cover the visible light region and to aim for more accurate color reproduction. As illustrated in FIG. 3, for example, in a case where three primary colors of RGB are used, there are two spectral valleys, and thus it is desirable to add an element capable of imaging two or more colors capable of covering the respective valleys.

Furthermore, instead of Cy, emerald having a similar peak position may be used. Although not illustrated, emerald is expressed by a spectrum having a peak between B and G. Spectra of such Cy and emerald are also useful for generating negative components in a color matching function. Furthermore, as another example, an element that receives white light having a spectrum as a whole may be provided.

By using more than three colors as described above, color reproducibility in an image can be improved, and, furthermore, the accuracy of estimation of a light source in the light source estimation unit 130 described above can be improved.

First Embodiment

Figure 4:
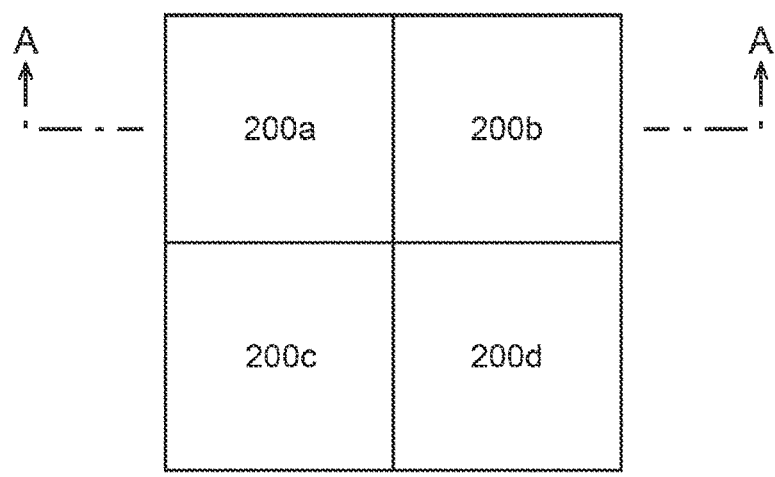
FIG. 4 is a diagram illustrating a relationship between a pixel and a light receiving element according to an embodiment.

FIG. 4 is a diagram illustrating an example of a pixel included in the imaging element 114. In the present drawing, a plurality of light receiving elements 200 is provided in the pixel, but the present disclosure is not limited to such a configuration, and even in other forms such as one-to-one correspondence between the pixel 20 and the light receiving element 200, a combination of colors described below can be similarly applied. Note that, in the present drawing, a disposition of the light receiving elements 200 in the pixel is mainly illustrated, but it is assumed that those not illustrated such as signal lines and light blocking walls are provided as appropriate.

The pixel 20 includes, for example, four light receiving elements 200a, 200b, 200c, and 200d. Each of the light receiving elements 2000a to 200d includes an independent photodiode and an independent organic photoelectric conversion film. Filters of different colors may be provided on these imaging elements, and some of them may be provided with filters of the same color. In the case of the organic photoelectric conversion film, the light receiving element itself may be configured to receive light having a spectrum of different colors or the same color.

As an example, the light receiving elements 200a and 200d may receive light having a spectrum of Mg, and the light receiving elements 200b and 200c may receive light having a spectrum of R. Such a configuration example will be described in more detail later on the basis of various variations.

Figure 5:
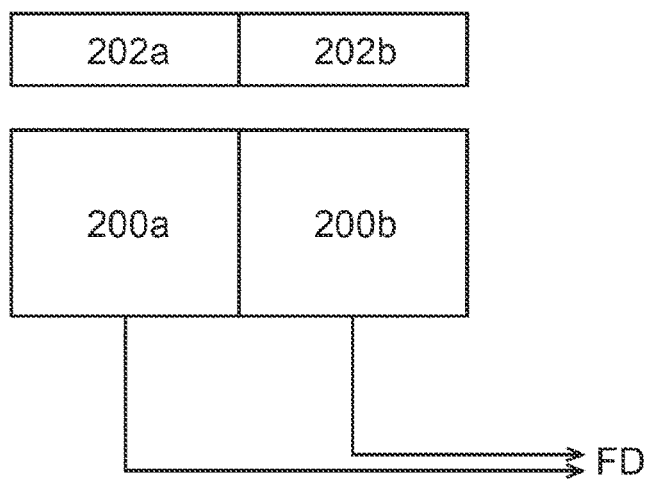
FIG. 5 is a sectional view taken along line A-A in FIG. 4.

FIG. 5 is a sectional view taken along line A-A in FIG. 4. In the present drawing, the light receiving element 200 includes, for example, a photodiode. An insulating film may be provided between these photodiodes. As such a split photodiode, for example, a semiconductor device as disclosed in Japanese Patent Application Laid-Open No. 2013-045917 may be used, or a semiconductor device in another system may be used.

A filter 202a through which light corresponding to the spectrum received by the light receiving element 200a is transmitted is provided above the light receiving element 200a. Similarly, a filter 202b is provided above the light receiving element 200b. According to the above example, the filter 202a is a filter through which Mg light is transmitted, and the filter 202b is a filter through which R light is transmitted.

Each of the light receiving elements 200a and 200b converts the received light into an analog signal and outputs the analog signal to an appropriate portion such as a floating diffusion in the pixel 20. The light receiving elements 200a and 200b may output analog signals at appropriate timings, or may output analog signals at the same timing.

Figure 6:
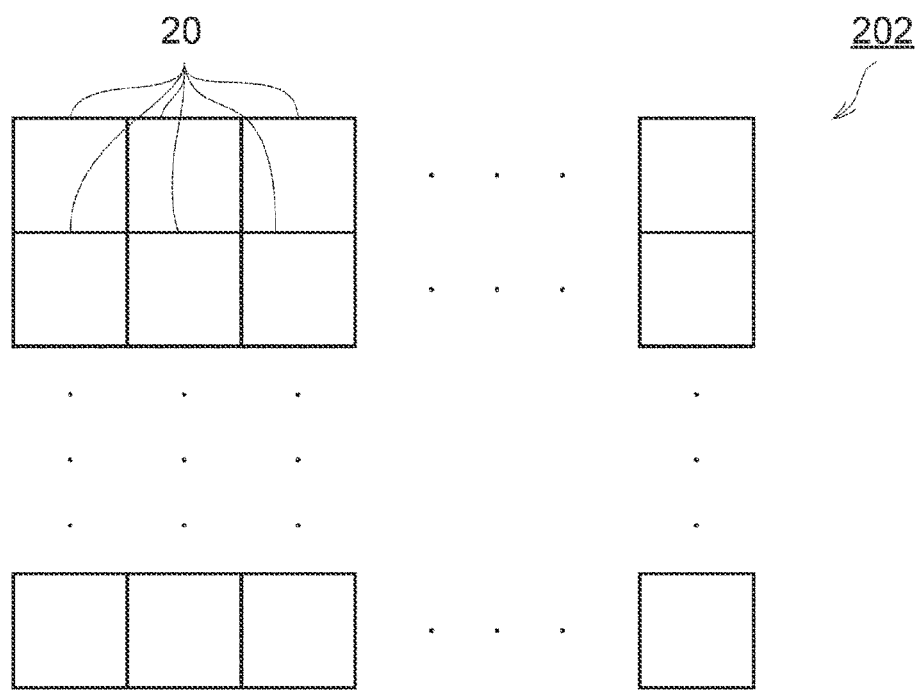
FIG. 6 is a diagram schematically illustrating a pixel and a pixel array according to an embodiment.

FIG. 6 is a diagram illustrating an example of a pixel array including pixels. As illustrated in FIG. 6, a plurality of pixels 20 is provided in an array. The pixels provided in an array form a pixel array 204. Then, the pixel array 204 is provided in the light receiving unit 100, and converts received light into analog signals on the basis of the characteristics of the respective light receiving elements 200 and outputs the analog signals. Each pixel 20 may be provided with the light receiving element 200 as a divided pixel as illustrated in FIG. 5, or as described above, a form described below may be appropriately represented by acquiring a color determined for each pixel 20 without using the divided pixel.

As described above, the pixel 20 may include the light receiving element 200 that forms divided pixels, and each divided pixel may receive light via a different filter. Hereinafter, color acquisition using this configuration will be described. As described above, as some examples, receiving light of two colors in the pixel 20 will be first described. These two colors are desirably similar colors. Here, the similar colors are, for example, a combination of R and Mg, G and Ye, or B and Cy. In addition to this, a combination of G and emerald or B and emerald may be used. In the combination of these colors, as can be seen from the spectrum, colors having a common wavelength component of a predetermined value or more can be defined.

Figure 7:
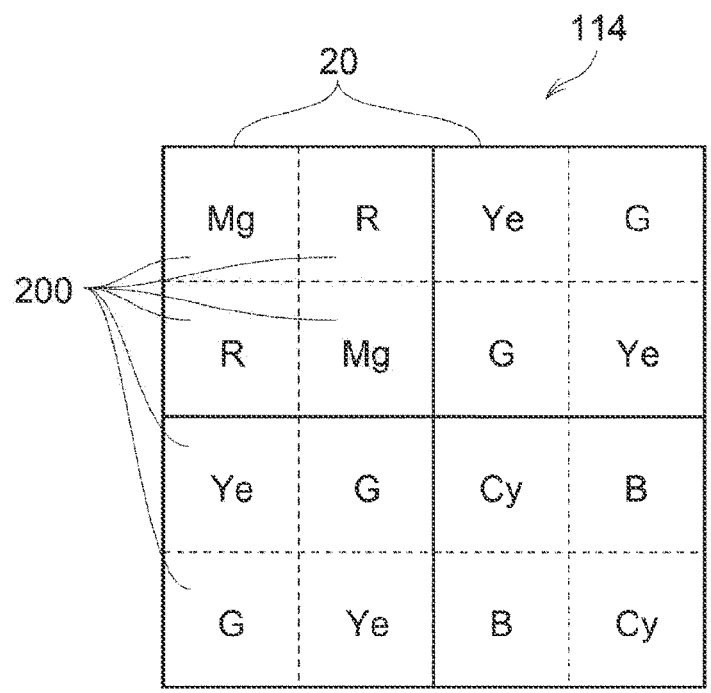
FIG. 7 is a diagram illustrating an array of colors of light received in the pixel according to an embodiment.

FIG. 7 is a diagram illustrating an example of a combination of colors of light received in the pixel 20 according to the embodiment. In the color notations in the drawing, similarly to the specification, R represents red, G represents green, B represents blue, Mg represents magenta, Ye represents yellow, and Cy represents cyan.

As a combination of the four pixels 20, there is a combination as illustrated in FIG. 7. In the upper left pixel 20, the upper left and lower right light receiving elements 200 receive Mg light, and the upper right and lower left imaging elements 114 receive R light. R and Mg are similar colors as described above.

In the upper right and lower left pixels 20, the upper left and lower right light receiving elements 200 receive Ye light, and the upper right and lower left light receiving elements 200 receive G light. G and Ye are similar colors as described above.

In the lower right pixel 20, the upper left and lower right light receiving elements 200 receive Cy light, and the upper right and lower left light receiving elements 200 receive B light. B and Cy are similar colors as described above.

As described above, the light receiving elements 200 (or the filter 202) are disposed to receive light of a similar color combination for each pixel 20. By disposing similar colors in the same pixel 20, the influence of color mixing can be reduced compared with a case where dissimilar colors are disposed in the same pixel 20.

Conversely, although not illustrated, similar colors may be included in different pixels 20. As described above, by disposing similar colors in different pixels 20, a color resolution can be increased. As described above, a color distribution in the pixel 20 can be appropriately changed according to an environment or an application.

As illustrated in the drawing, the pixel 20 of an R system, the pixel 20 of a G system, and the pixel 20 of a B system may be arranged in a Bayer array. The Bayer array is given as a non-limiting example, and other arrays such as an example of a checkered array or an array of an RGBW system may be used.

In the pixel 20 having an array for receiving light as illustrated in FIG. 7, an analog signal can be collectively output for each pixel 20. For example, light of mixed colors of R and Mg can be received from the pixel 20 in the upper left of FIG. 7, and an analog signal based on an intensity of the received light can be output. Similarly, an analog signal corresponding to light of mixed colors of G and Ye can be output from the upper right and lower left pixels 20, and an analog signal corresponding to light of mixed colors of B and Cy can be output from the lower right pixel 20.

As described above, by collectively acquiring signals from the divided pixels (light receiving elements 200) in the pixel 20, it is possible to reduce reading noise and suppress a decrease in a frame rate. For example, in a scene of super-illuminance, light may be collectively received for each pixel 20 in order to reduce reading noise. Furthermore, by collectively reading the signals, it is also possible to acquire analog signals in different exposure amounts between frames and perform high dynamic range rendering (HDR).

On the other hand, it is also possible to change reading timings at the divided pixels in the pixel 20.

Figure 8:
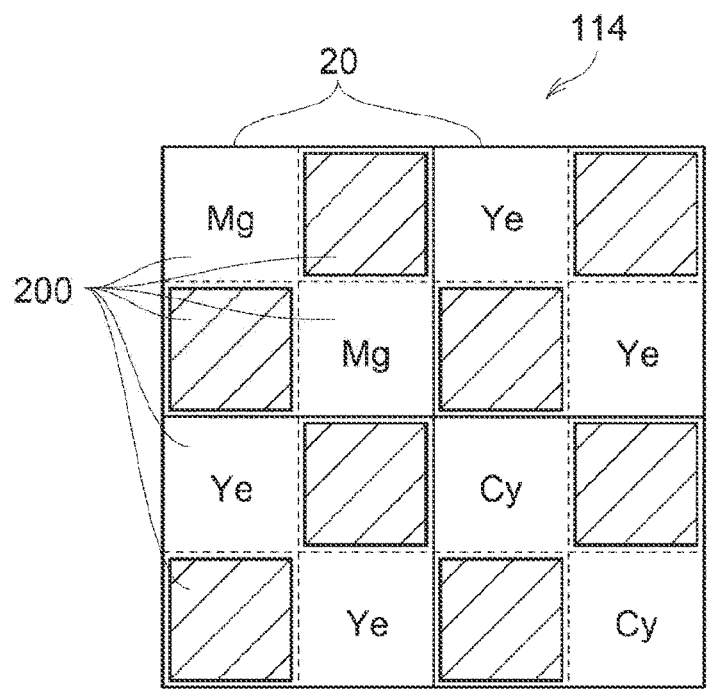
FIG. 8 is a diagram illustrating colors of light received at a predetermined timing in the pixel according to an embodiment.
Figure 9:
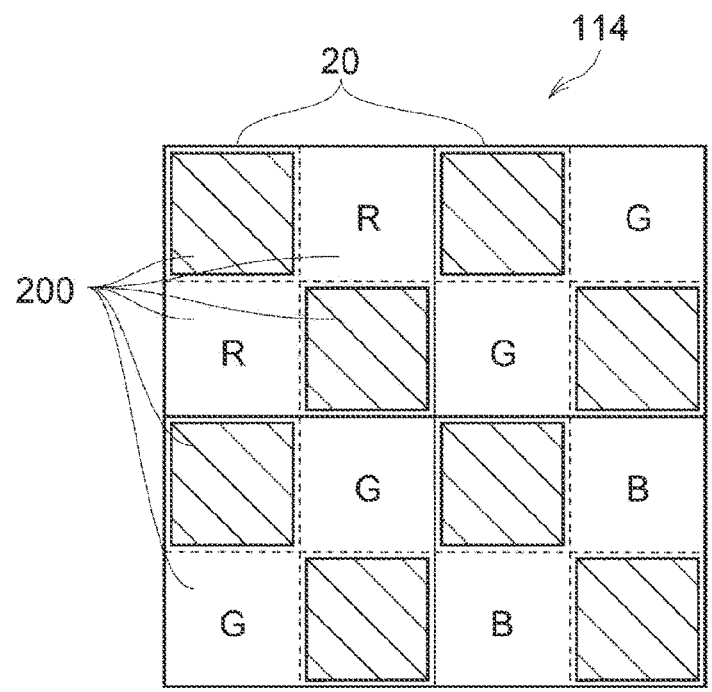
FIG. 9 is a diagram illustrating colors of light received is at a predetermined timing in the pixel according to an embodiment.

FIGS. 8 and 9 are diagrams illustrating an example in which read timings are set to different timings in the pixel 20.

In the solid-state imaging device 10, for example, at a certain reading time, as illustrated in FIG. 8, the pixel 20 acquires an analog signal on the basis of an intensity of light in the complementary color system of Mg, Ye, and Cy. At the next reading time, as illustrated in FIG. 9, the solid-state imaging device 10 acquires an analog signal on the basis of an intensity of light in the primary color systems of R, G, and B. That is, the light receiving elements 200*a* and 200*d* in FIG. 4 may output analog signals to the floating diffusion at the same timing, and the light receiving elements 200*b* and 200*c* may output analog signals to the floating diffusion at the same timing.

As described above, a reading timing may be shifted. For example, this reading may be performed for each frame. While a frame rate is lower than that in a case where collective reading is performed in the pixels 20 as described above, the solid-state imaging device 10 can acquire information of five or more colors (In the present embodiment, six colors are used.).

By acquiring spectral information of five or more colors, the color reproducibility can be improved by reproducing the color matching function more faithfully, and image creation with high performance can be realized. By using multiple colors, the accuracy of light source estimation, scene determination, and object identification is improved, and thus a color of a specific object/living body can be expressed more vividly. For example, by increasing the saturation of a certain food, it is possible to create an image that does not lose freshness.

As described above, it is also possible to perform object recognition and living body recognition on the basis of the acquired spectrum information. Then, the solid-state imaging device 10 may change a control parameter for image reconstruction on the basis of the result of the living body recognition or the like. The control parameter may be, for example, a parameter related to digital signal processing such as a kernel of a filter in image processing or a parameter in gamma correction, or may be a parameter such as a weighting parameter for combining frames or the number of frames to be combined. Furthermore, this parameter may be a parameter used when combining the first information and the second information.

In the present embodiment, the acquired color information can be processed by the linear matrix unit 124, the luminance chroma signal generation unit 140, and the like. Therefore, it is possible to improve saturation appropriate for an object or the like. That is, in the image creation of the solid-state imaging device 10 according to the present embodiment, not only the overall color saturation can be increased, but also more appropriate saturation improvement using information of five or more colors can be achieved.

In the above description, the color information is acquired at the same timing or different timings at all the timings of all the pixels 20, but the present disclosure is not limited thereto. For example, a frame may be divided for every three frames, and reading may be performed at the same timing for each pixel 20 in one frame, and reading may be performed at different timings for each pixel 20 in the other two frames as illustrated in FIGS. 8 and 9. For example, in a case where three frames are combined in a scene where a bright portion and a dark portion are mixed, image information may be generated from information obtained through reading at different timings in which an exposure amount is suppressed for the bright portion, and image information may be generated from information obtained through collective reading with priority given to a signal to noise ratio (SNR) for the dark portion.

In the above description, Ye is used to improve color reproducibility, but the present disclosure is not limited thereto. The pixel 20 that acquires information of G does not have to acquire information of Ye, for example. Furthermore, as described above, emerald may be used instead of Ye or instead of Cy. Furthermore, a complementary color provided in the same pixel 20 as R may be Ye.

Furthermore, as described above, it is desirable to acquire an analog signal from an intensity of light of five or more colors, but the present disclosure is not limited thereto, and information may be acquired by using RGBW. For example, the divided pixels of the complementary color system in FIG. 7 may be white pixels. However, for the reasons described above, it is more desirable to use a complementary color system and a primary color system that are similar colors.

By using the pixel 20 as in the present embodiment, color information of five or more colors can be acquired with high accuracy in a monocular camera. Furthermore, even in a case where there is a subject or the like having a pattern in an oblique direction, it is possible to acquire information of either RGB or CMY so as to cross the pattern. According to the present embodiment, the solid-state imaging device 10 can interpolate each piece of acquired information and aggregate the information into, for example, RGB information. Therefore, it is possible to appropriately reconstruct an image even for a subject having a pattern in an oblique direction.

Note that, in the above description, the light receiving elements 200*a* and 200*d* and the light receiving elements 200*b* and 200*c* in FIG. 4 receive light of the same color in each combination, but the present disclosure is not limited thereto. For example, the light receiving elements 200*a* and 200*b* and the light receiving elements 200*c* and 200*d* may receive light of the same color. As another example, the light receiving elements 200*a* and 200*c*, and the light receiving elements 200*b* and 200*d* may receive light of the same color.

Modification Example

In the above description, the light receiving element 200 included in the pixel 20 acquires visible light information, but the present disclosure is not limited thereto.

Figure 10:
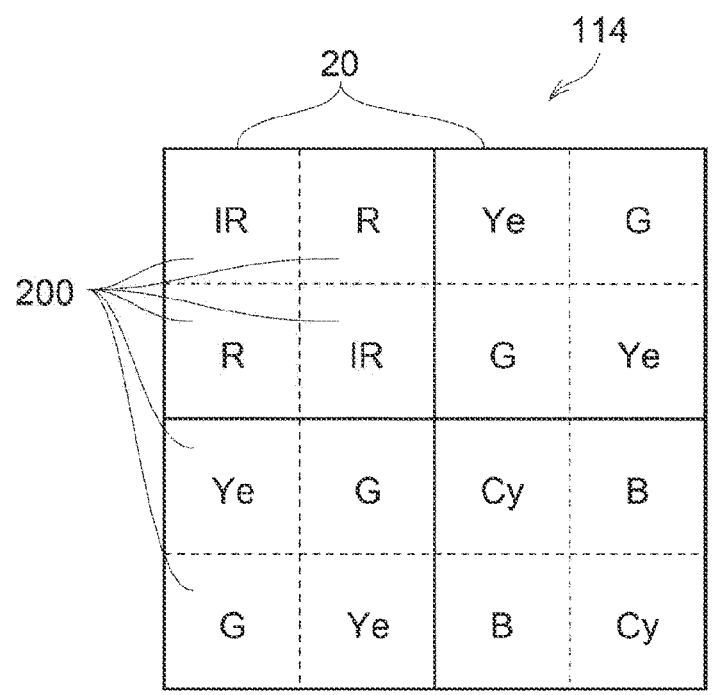
FIG. 10 is a diagram illustrating the type of light received in the pixel according to an embodiment.

FIG. 10 is a diagram illustrating a non-limiting example of the pixel 20 according to the modification example of the first embodiment. In the pixel 20 that receives light of the R system, a divided pixel indicated as IR is illustrated. This IR indicates the light receiving element 200 that receives infrared light. Hereinafter, in the case of color, IR may be included. That is, IR may be used as a color similar to R.

In this case, the IRCF 112 illustrated in FIG. 2 may be omitted. In order to omit the IRCF 112, the IRCF may be individually provided in the light receiving element 200 other than the light receiving element 200 that receives light of IR.

As illustrated in FIG. 10, in the pixel 20, a light receiving element 200 that receives light of IR as a color similar to R may be included as a divided pixel. By receiving light of IR, it is possible to acquire information that is difficult to acquire in a spectrum range of visible light. As a result, for example, the performance of estimation and recognition in the light source estimation unit 130 and the object recognition unit 132 can be improved.

Second Embodiment

In the above description, the array useful in a monocular camera has been described. However, in a case where a compound-eye camera is used, more various arrays can be used.

Figure 11:
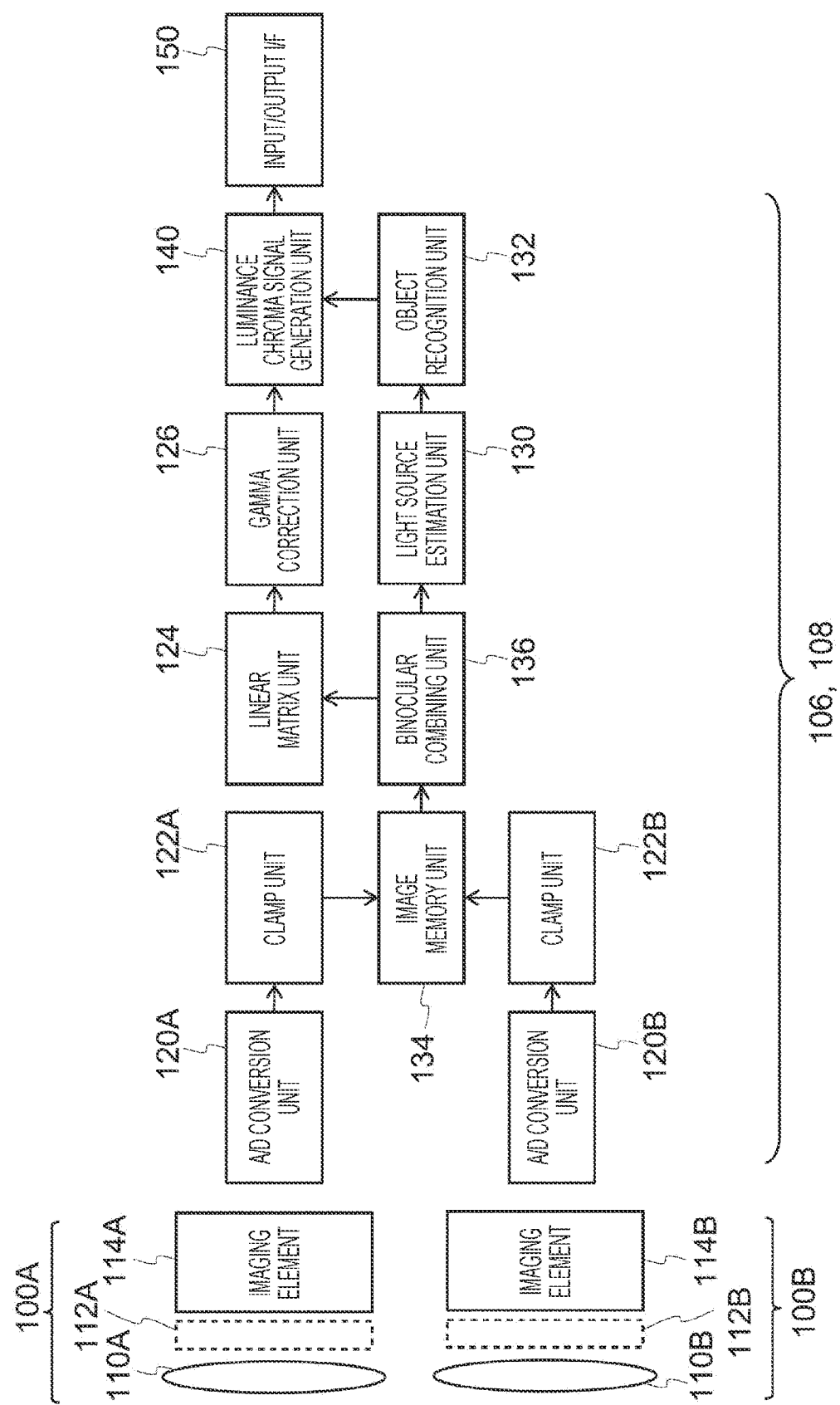
FIG. 11 is a diagram illustrating an example of a block diagram of a solid-state imaging device according to an embodiment.

FIG. 11 is an example of a block diagram of a solid-state imaging device 10 according to the present embodiment. The solid-state imaging device 10 includes a first light receiving unit 100A and a second light receiving unit 100B.

The first light receiving unit 100A includes, for example, a lens 110A, an IRCF 112A, and an imaging element 114A, and the second light receiving unit 100B includes, for example, a lens 110B, an IRCF 112B, and an imaging element 114B. For example, the first light receiving unit 100A acquires first information, and the second light receiving unit 100B acquires second information.

An A/D conversion unit and a clamp unit are provided in each imaging element.

An image memory unit 134 stores outputs from clamp units 122A and 122B respectively corresponding to the first light receiving unit 100A and the second light receiving unit 100B.

A binocular combining unit 136 converts information acquired from the imaging elements 114A and 114B into appropriate data. For example, the binocular combining unit 136 combines pieces of information acquired by the separate imaging elements 114A and 114B, the pieces of information being acquired at the same timing.

For this combination, various methods may be used. For example, in a case where the solid-state imaging device 10 captures a moving image, simple color information may be acquired as a thinned output on the basis of data acquired from an imaging element that receives light of RGB, and a hue may be corrected by using the thinned information on the basis of data acquired from an imaging element that receives light of the complementary color system. Furthermore, a bright portion and a dark portion may be determined, and an image may be generated on the basis of pieces of information respectively acquired from imaging elements of the RGB system and imaging elements of the complementary color system. Furthermore, the binocular combining unit 136 may be configured to perform processing on a cloud instead of performing processing in the solid-state imaging device 10.

The solid-state imaging device 10 acquires and outputs an image signal and a video signal by performing a process similar to that of each constituent in FIG. 2 on the basis of the output synthesized by the binocular combining unit 136.

Figure 12:
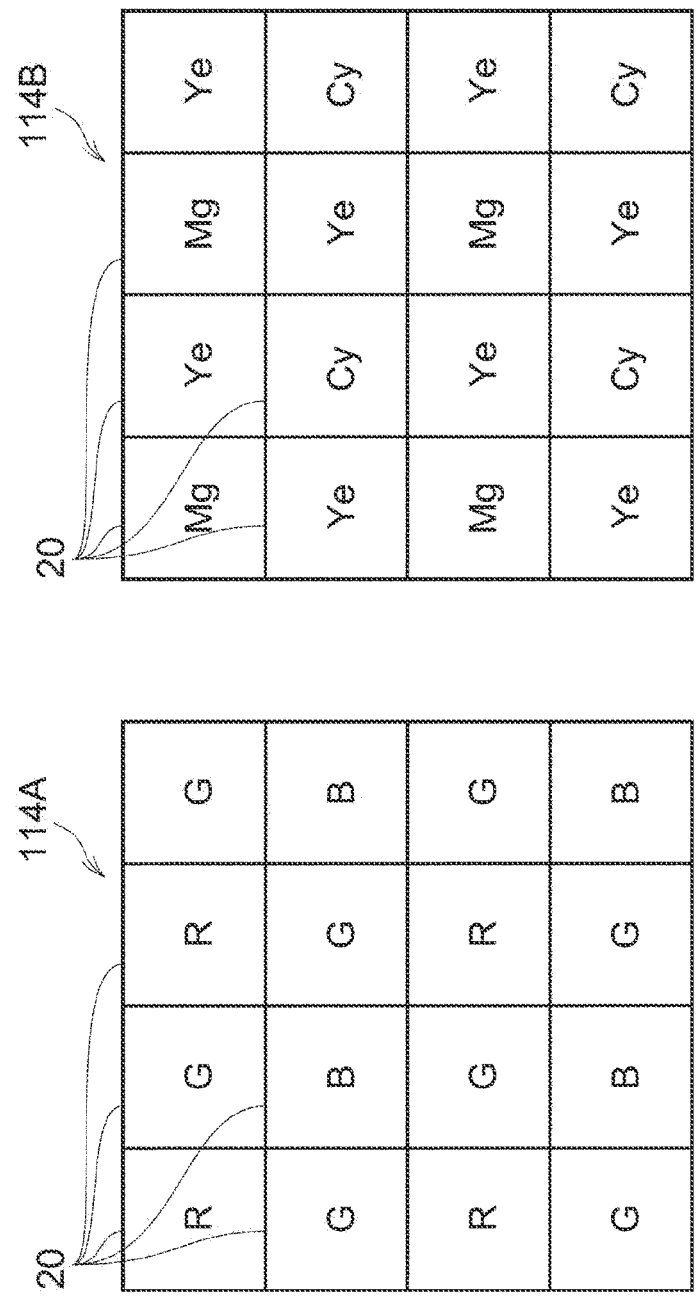
FIG. 12 is a diagram illustrating an array of colors of light received in the pixel according to an embodiment.

FIG. 12 is a diagram schematically illustrating pixels 20 in each camera. The imaging element 114A includes light receiving elements that receive light of R, G, and B of the three-primary color system, and the imaging element 114B includes light receiving elements that receive light of Mg, Ye, and Cy of the complementary color system. Unlike the configuration of the pixel 20 illustrated in FIG. 4 and the like, light of one color may be received for each pixel.

Since the light receiving elements 200 having similar light reception sensitivities are aggregated in the respective imaging elements 114, it is possible to perform suitable exposure control. For example, in a case where the intensity of light is weak (dark) in the surrounding environment, an image is generated on the basis of an output of the imaging element 114B that is a complementary color system having a high light reception sensitivity, and color correction may be performed by using an output of the imaging element 114A that is a primary color system having a low light reception sensitivity. On the other hand, in the case of bright, color correction may be performed on an image based on an output of the imaging element 114B that is a primary color system a having low light reception sensitivity, by using an output of the imaging element 114A that is a complementary color system having a high light reception sensitivity.

The exposure control may be performed, for example, in an exposure amount different between the primary color and the complementary color. In this exposure control, a shutter time may be changed, or a gain may be changed. By making these two types of control variable, for example, in an RGB+CMY array, by setting RGB to a short storage time and CMY to a long storage time, it is also possible to image a dark portion of a subject to be imaged with CMY having a large exposure amount and to image a bright region with RGB. Thus, an HDR video can be acquired.

As described above, a short storage time may be read as a low gain, and a long storage time may be read as a high gain. That is, control may be performed such that RGB is acquired with a low gain and CMY is acquired with a high gain. In this case as well, it is possible to acquire a video having a high dynamic range.

That is, the first information with low sensitivity and the second information with high sensitivity can be interpolated with each other. Furthermore, in addition to this, color correction may be appropriately executed in the binocular combining unit 136 according to characteristics of a color to be received.

Figure 13:
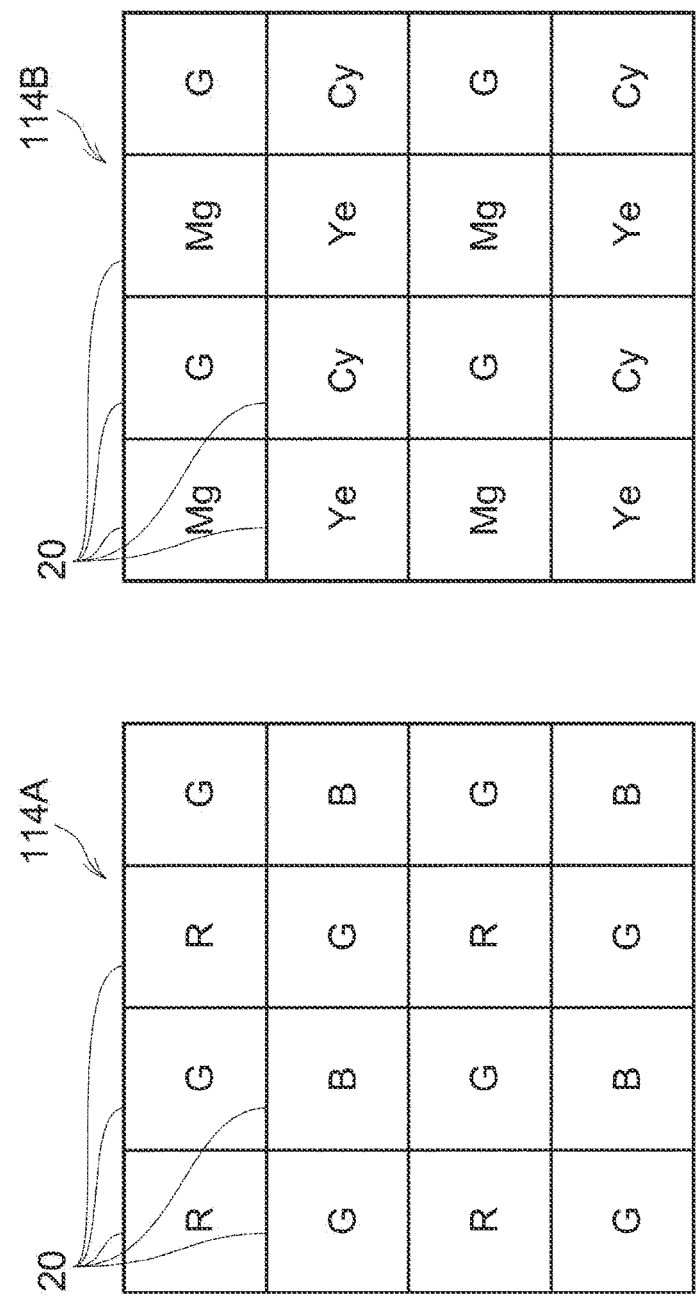
FIG. 13 is a diagram illustrating an array of colors of light received in the pixel according to an embodiment.

FIG. 13 is a diagram illustrating another array of received light colors in a case where a binocular camera is used. As illustrated in FIG. 13, the imaging element 114B that acquires the second information may be configured to acquire light of G that is the three-primary color system.

In a case where the binocular imaging elements 114 are used, it is necessary to correct parallax at the timing of combining the outputs from the respective imaging elements 114. For example, the binocular combining unit 136 combines colors of the respective pixels 20 while executing pattern matching. In the case of performing pattern matching as described above, the accuracy of matching may decrease as a color difference increases.

In contrast, by employing the configuration of the pixel 20 as illustrated in FIG. 13, light reception information of G light can be mixed in the second information, and thus light reception information of G can be acquired as information common to the first information. Therefore, the accuracy of pattern matching can be improved.

Figure 14:
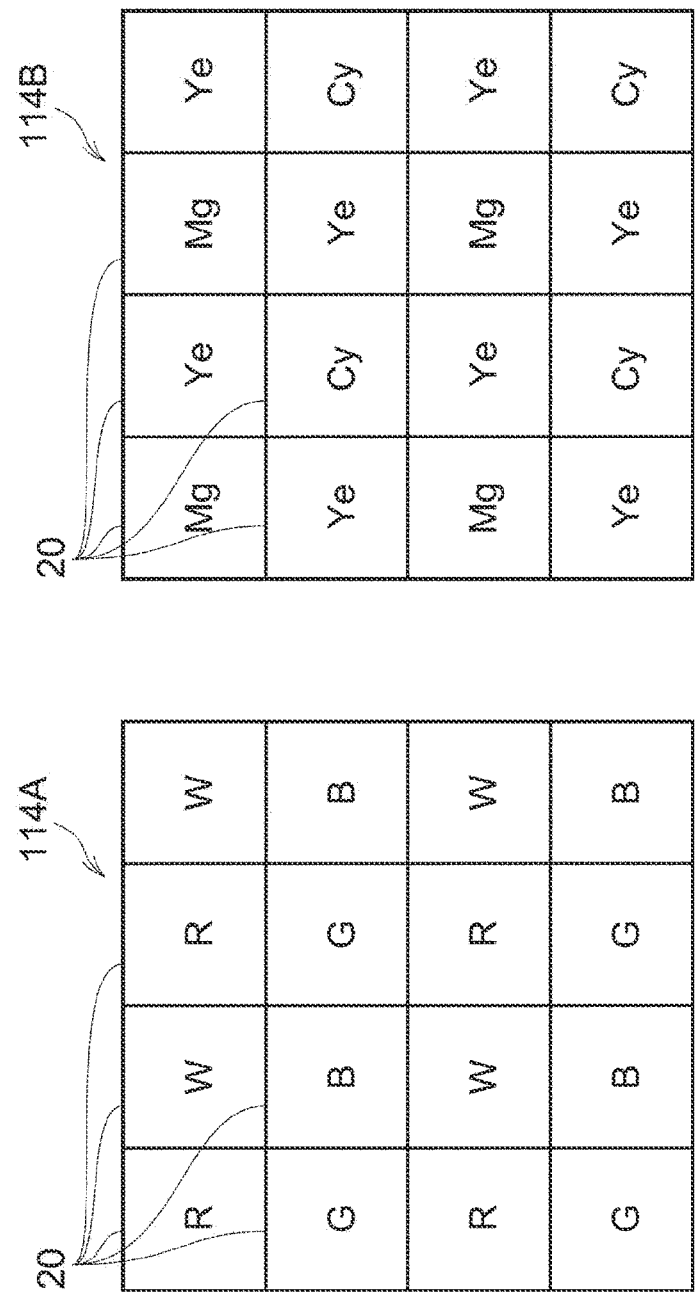
FIG. 14 is a diagram illustrating an array of colors of light received in the pixel according to an embodiment.

FIG. 14 is a diagram illustrating still another array of colors of received light in a case where a binocular camera is used. As illustrated in FIG. 14, in the imaging element 114A that acquires the first information, white (W) light may be acquired in addition to the three primary colors.

With such a configuration, it is possible to acquire information with high sensitivity for RGB light acquired as the first information. Note that the W pixel 20 may be provided as the pixel 20 on the second information side, that is, the imaging element 114B side.

Figure 15:
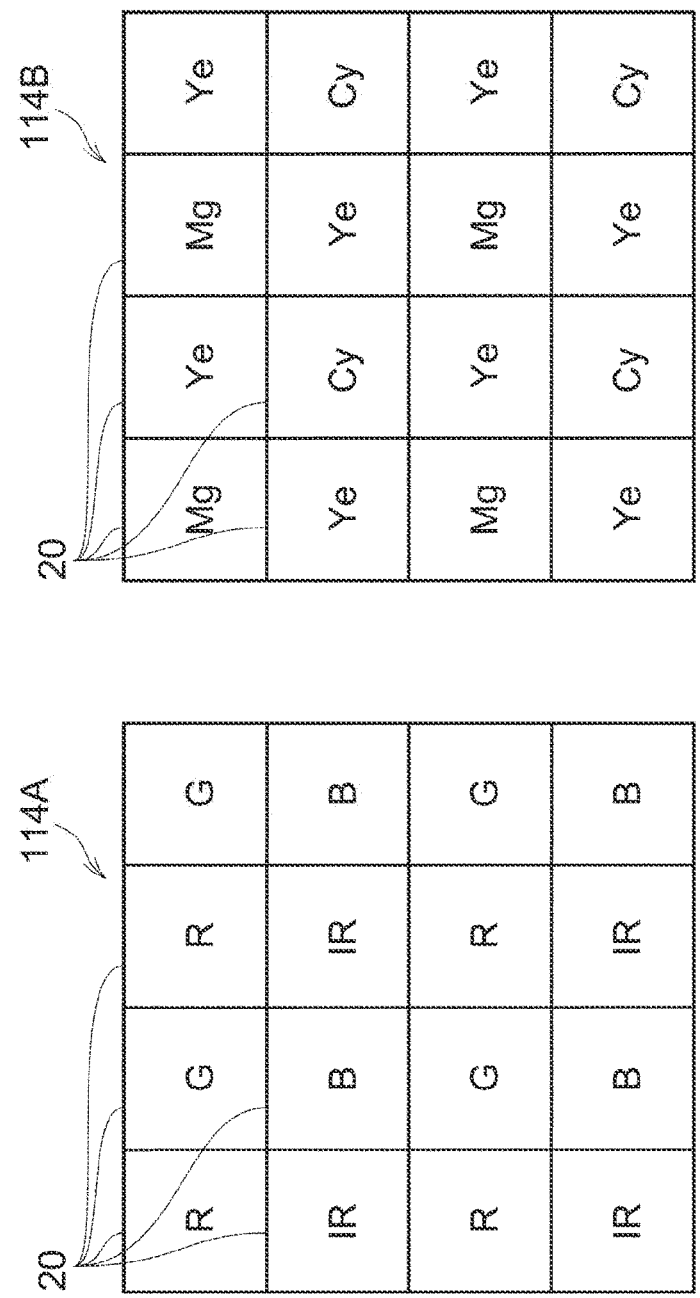
FIG. 15 is a diagram illustrating an array of colors of light received in the pixel according to an embodiment.

FIG. 15 is a diagram illustrating still another array of colors of received light in a case where a binocular camera is used. As illustrated in FIG. 15, the imaging element 114A that acquires the first information may be configured to acquire IR (infrared) light in addition to the three primary colors.

By receiving IR light, the accuracy of light source estimation, object recognition, and the like can be improved. Similarly to the above-described embodiments, it is desirable that the imaging element 114 that receives IR light is not provided with the IRCF 112. In this case, a filter that removes or absorbs IR light may be individually mounted in the pixel 20 other than the pixel 20 that receives IR light.

The solid-state imaging device 10 in the block diagram illustrated in FIG. 11 can be used for the imaging element 114 having the configurations illustrated in FIGS. 12 to 15. As described above, in a case where the imaging element 114 receives IR light, the IRCF 112A is not inserted.

In comparison with FIG. 2 which is a block diagram in the case of a monocular configuration, a configuration of combining information from a binocular configuration is added. As described above, the binocular combining unit 136 performs, for example, pattern matching, and then combines outputs from the two imaging elements 114A and 114B. In the configurations in FIGS. 12 to 15, outputs of six or seven colors are appropriately combined. Object recognition or the like may be executed by using a trained neural network model (not illustrated) by using at least one of the plurality of colors. This neural network model may be optimized according to, for example, a deep learning method.

Note that the array based on the Bayer array of the colors of received light illustrated in FIGS. 12 to 15 is a non-limiting example. An array other than the array based on the Bayer array as illustrated in these drawings may be used as long as the above-described effect can be appropriately achieved.

As described above, according to the present embodiment, even in the case of the binocular configuration, it is possible to appropriately reconstruct an image output from the solid-state imaging device 10 by receiving light of five or more colors.

The present embodiment can also be applied to a case of three or more compound eyes.

Furthermore, in the case of a compound eye, a size of the optical system can be set to any size. Furthermore, a resolution of the imaging element 114 and the number of pixels 20 may also be freely set for each imaging element 114. That is, the first information and the second information may be information acquired at different resolutions.

As described above, by changing a size, a resolution, and the like of the optical system in the compound eye, it is possible to acquire images with different resolutions and the like from the three-primary color system and the complementary color system, respectively, and by using these pieces of information mutually, it is possible to further increase the resolution or further improve the color reproducibility.

By setting the first information and the second information to have different resolutions, for example, the solid-state imaging device 10 may capture a still image and a moving image in separate imaging modes. For example, in the moving image mode, by normally driving the complementary color system, the power consumption of reading may be reduced such that the three-primary color system is used as a signal assist with the complementary color system, and color information acquired from the three-primary color system may be transmitted to the complementary color side to assist with image creation. For example, the three-primary color system may be used as auxiliary pixels used for pixel addition (pixel binning) in the complementary color system. This can be similarly applied even in a case where divided pixels are used.

Moreover, the still image mode and the moving image mode may be combined at different timings and in different blocks. For example, in a case where real-time processing of a moving image is difficult due to a problem of processing speed, it is possible to take time to perform synthesis after imaging. In this case, an image reconstruction process for moving images may be executed in the signal processing unit 106 and the image processing unit 108, or moving images may be uploaded onto a cloud and image reconstruction processing may be executed in a server or the like with high performance.

Furthermore, the imaging element 114 in two or more compound eyes may be configured by using divided pixels similar to those in the above-described embodiment in the monocular configuration. In this case, an application may be changed in a plurality of cameras. For example, cameras may be used for different applications, such as one camera being a wide-angle camera and one camera being a normal camera. Of course, it is also possible to acquire a high-resolution image or improve color reproducibility by using data acquired from the plurality of types of cameras.

Third Embodiment

In the above-described embodiment, a color filter or an organic photoelectric conversion film is provided for each color, but the present disclosure is not limited thereto. For example, in a monocular camera, light of colors of the three-primary color system and the complementary color system may be received by using an organic photoelectric conversion film and a photodiode.

Figure 16:
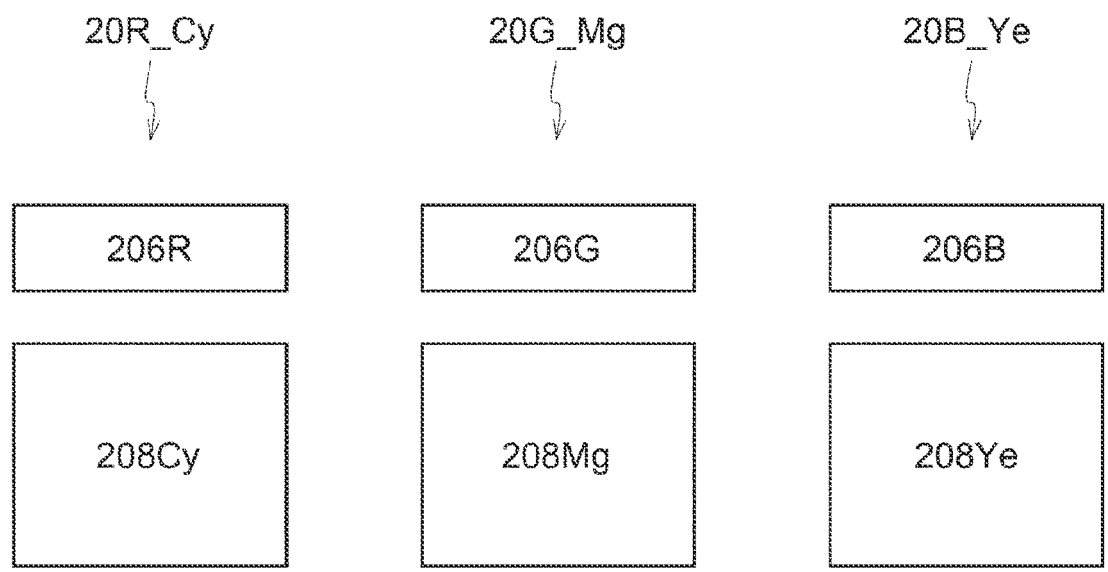
FIG. 16 is a diagram illustrating colors of light received in the pixel according to an embodiment.

FIG. 16 illustrates an example of a pixel 20 using an organic photoelectric conversion film and a photodiode as a light receiving element. The pixel 20R_Cy includes an organic photoelectric conversion film 206R that receives R light and a photodiode 208Cy that receives Cy light. Note that, although not illustrated, each optical system such as an on-chip lens may be provided on the pixel 20R_Cy on a side on which light from the outside is incident.

The pixel 20R_Cy having this configuration receives R light and outputs an analog signal based on the intensity of the R light in the organic photoelectric conversion film 206R. The light through the organic photoelectric conversion film 206R becomes light of Cy, which is a complementary color from which the R component has been removed, and is input to the photodiode 208Cy. Therefore, the photodiode 208Cy receives Cy light. As a result, the photodiode 208Cy receives the Cy light through the organic photoelectric conversion film 206R, and outputs an analog signal corresponding to the Cy light.

Similarly, a pixel 20G_Mg may be configured by a combination of an organic photoelectric conversion film 206G that receives G light and a photodiode 208Mg that receives Mg light. Furthermore, a pixel 20B_Ye may be configured by a combination of an organic photoelectric conversion film 206B that receives B light and the photodiode 208Ye that receives Ye light.

Figure 17:
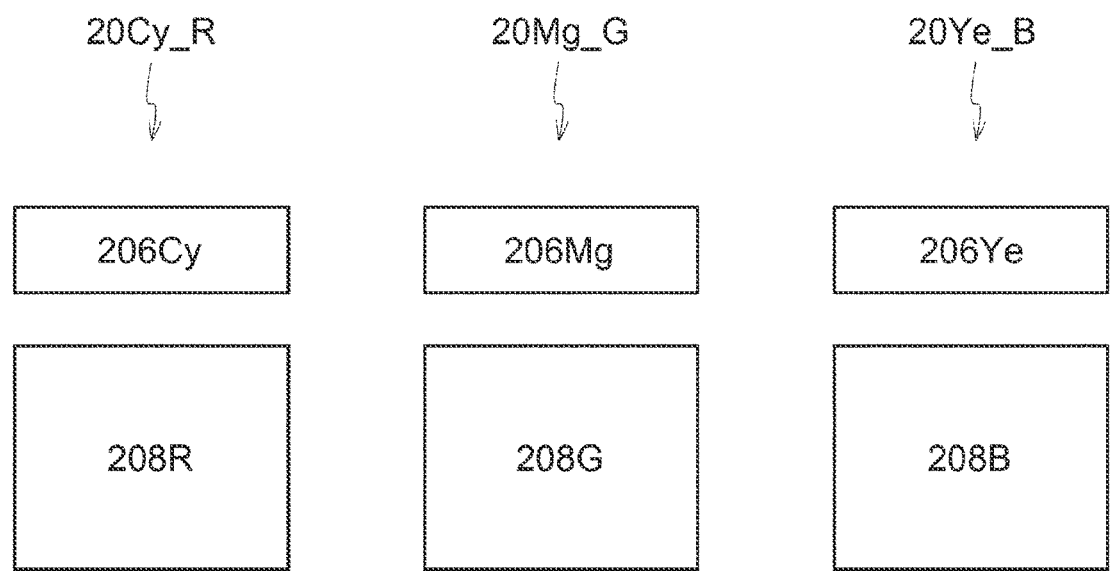
FIG. 17 is a diagram illustrating colors of light received in the pixel according to an embodiment.

FIG. 17 is a diagram illustrating another example of the configuration of the pixel according to the present embodiment. The pixel 20Cy_R includes an organic photoelectric conversion film 206Cy that receives Cy light and a photodiode 208R that receives R light.

The pixel 20Cy_R receives Cy light and outputs an analog signal based on the intensity of the Cy light in the organic photoelectric conversion film 206Cy. The light through the organic photoelectric conversion film 206Cy becomes light of R which is a complementary color from which the Cy component is removed, and is input to the photodiode 208R. Therefore, the photodiode 208R receives the R light. As a result, the photodiode 208R receives the R light through the organic photoelectric conversion film 206Cy, and outputs an analog signal corresponding to the R light.

Similarly to the case of FIG. 16, a pixel 20Mg_G may be configured by a combination of an organic photoelectric conversion film 206Mg that receives Mg light and ae photodiode 208G that receives G light. Furthermore, a pixel 206Ye_B may be configured by a combination of an organic photoelectric conversion film 20Ye_B that receives Ye light and a photodiode 208B that receives B light.

In the examples in FIGS. 16 and 17, the filter 202 is not provided on the photodiode 208, but an appropriate filter 202 may be provided between the organic photoelectric conversion film 206 and the photodiode 208.

As described above, according to the present embodiment, it is possible to appropriately receive light of complementary colors in pixels disposed at the same position. With such a configuration, the monocular camera can appropriately receive light of the first information and the second information for each pixel 20. In this case, since a light reception position does not deviate between the first information and the second information, it is possible to appropriately improve color reproducibility from each piece of information without executing pattern matching or the like in image reconstruction.

Fourth Embodiment

In the second embodiment and the third embodiment, the information of the three-primary color system and the complementary color system is used, but as described above, a combination of colors is not limited thereto. For example, the second information may be information of Ye or emerald. It is possible to improve the accuracy of generating a negative component of the color matching function by receiving emerald light. Moreover, W light may be received.

Fifth Embodiment

Various applications of the pixels and the divided pixels described in each of the above embodiments will be described. In the following examples, color combinations are listed as a number of non-limiting examples.

Figure 18:
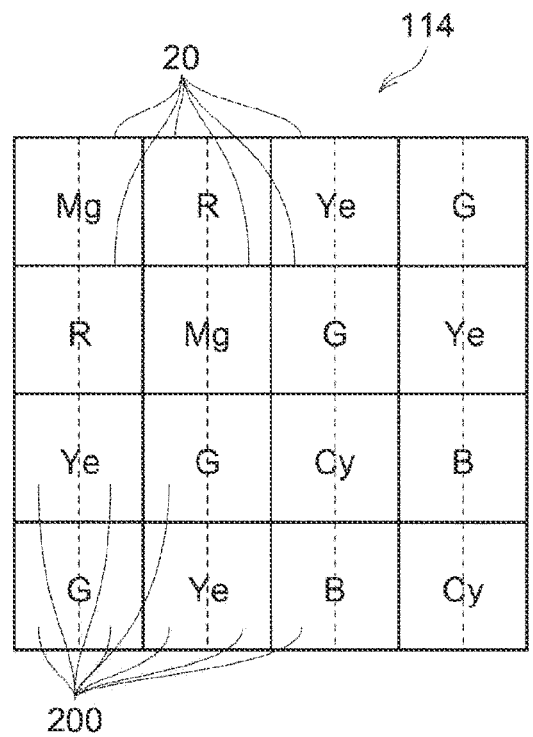
FIG. 18 is a diagram illustrating an example of formation of the pixel according to an embodiment.

FIG. 18 is a diagram illustrating an example of dividing the pixel 20. Pieces of light of R, G, B, Mg, Ye, and Cy are received for the respective pixels 20.

As illustrated in FIG. 18, the pixel 20 may be divided into two in a predetermined direction. Each of the divided regions is provided with, for example, a photodiode as the light receiving element 200.

Figure 19:
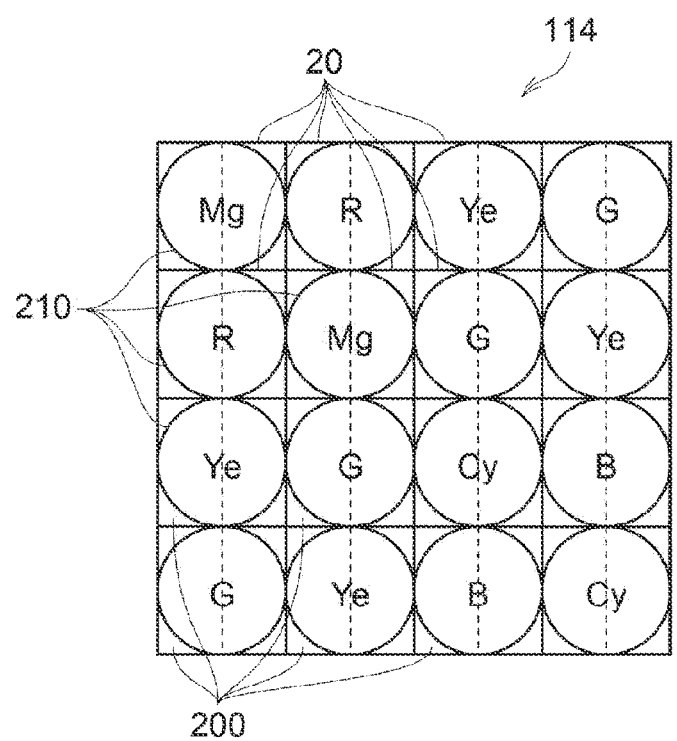
FIG. 19 is a diagram illustrating an example of formation of the pixel according to an embodiment.

FIG. 19 is a diagram illustrating an example of on-chip lens formation in the example in FIG. 18. By dividing the pixel as described above and providing an on-chip lens for each pixel as illustrated in FIG. 19, it is also possible to acquire parallax information for each pixel.

Figure 20:
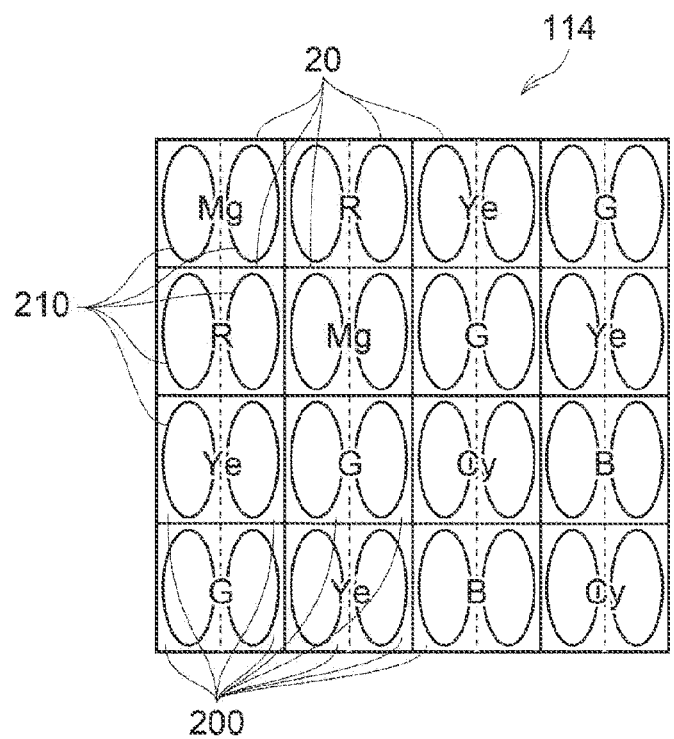
FIG. 20 is a diagram illustrating an example of formation of the pixel according to an embodiment.

FIG. 20 is a diagram illustrating an example of formation of an on-chip lens in the example in FIG. 18. An elliptical on-chip lens 210 may be provided for each divided pixel. In this case, a resolution can be improved.

Figure 21:
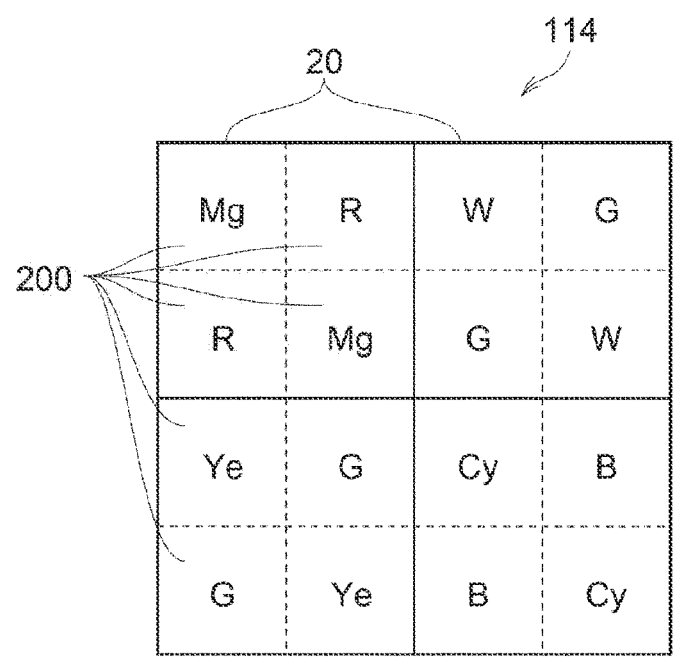
FIG. 21 is a diagram illustrating an example of formation of the pixel according to an embodiment.

FIG. 21 is a diagram illustrating another example of dividing the pixel 20. As illustrated in FIG. 21, an aspect may be employed in which the light receiving element 200 that receives W light is provided in the same pixel including the G light receiving element 200 (divided pixel). Moreover, instead of W light, the light receiving element 200 may receive light of a color such as emerald as described above. As described above, some divided pixels may have a combination different from the example in FIG. 7 and the like.

Figure 22:
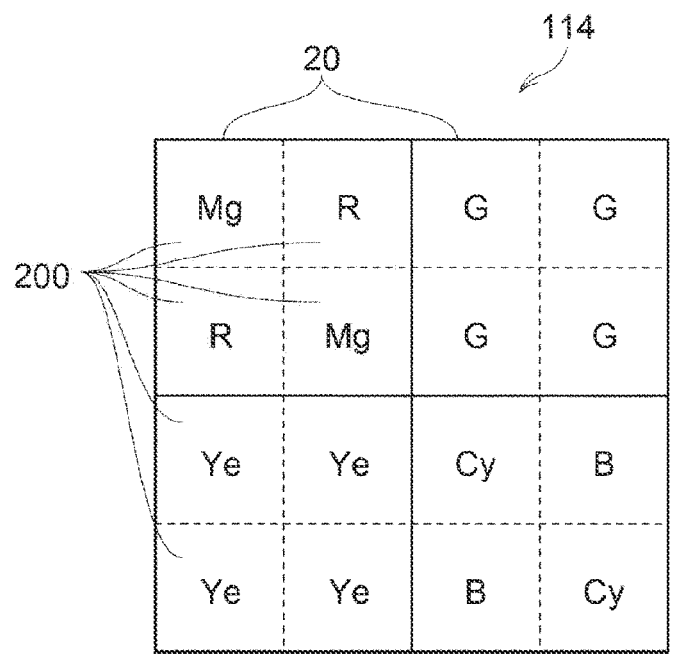
FIG. 22 is a diagram illustrating an example of formation of the pixel according to an embodiment.

FIG. 22 is a diagram illustrating another example of dividing the pixel 20. As illustrated in FIG. 22, the pixel 20 that receives G light and the pixel 20 that receives Ye light may be separated. By employing such a form, in the pixels 20 that receives the G and Ye light, analog signals can be acquired at a collective timing, and a frame rate can be improved.

Figure 23:
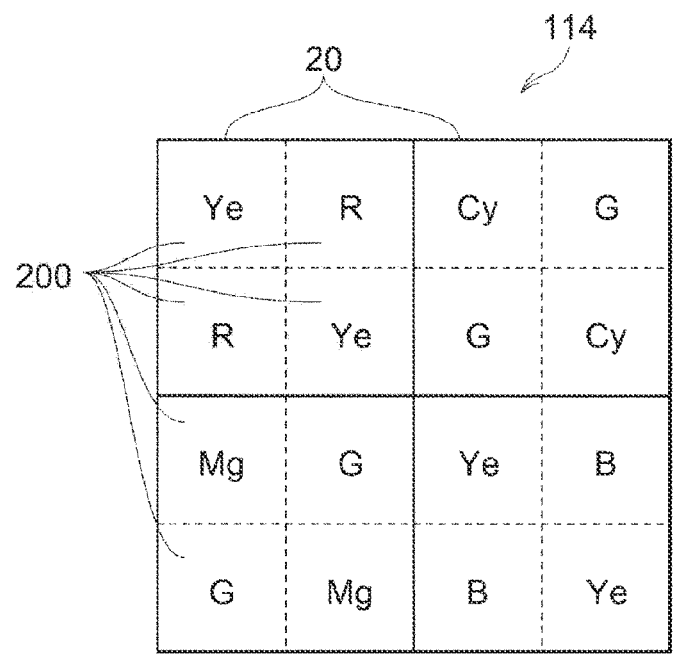
FIG. 23 is a diagram illustrating an example of formation of the pixel according to an embodiment.

FIG. 23 is a diagram illustrating still another example of dividing the pixel 20. As illustrated in FIG. 23, an aspect may be employed in which complementary colors are provided in different pixels 20. In this case, for example, as illustrated in the figure, a form may be employed in which the pixel 20 having R and Ye divided pixels, the pixel 20 having B and Ye divided pixels, the pixel 20 having G and Mg divided pixels, and the pixel 20 having G and Cy divided pixels are arranged such that a large number of G and Ye divided pixels are disposed. When the pixels are formed as described above, any pixel 20 is provided with divided pixels that receive green light having high light reception intensity for human eyes, and thus color reproducibility and the like can be improved.

Figure 24:
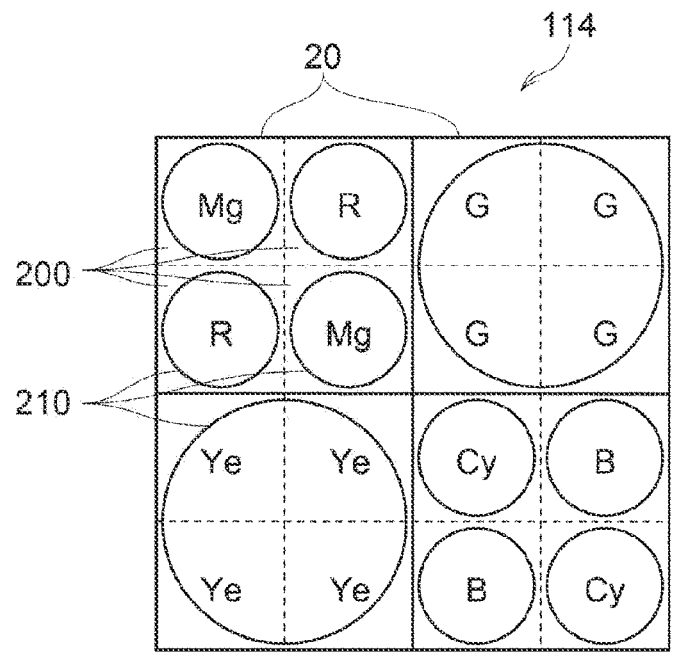
FIG. 24 is a diagram illustrating an example of formation of the pixel according to an embodiment.

FIG. 24 is a disposition example of on-chip lenses in the case of FIG. 22. As illustrated in FIG. 24, in a case where divided pixels that receive light of different colors are provided in the pixel 20, on-chip lenses 210 having sizes to be applied to the divided pixels may be provided. On the other hand, in a case where light of the same color is received in the pixel 20, the on-chip lens 210 over the pixel 20 may be provided.

Of course, at least one of G or Ye may include two elliptical on-chip lenses as illustrated in FIG. 21.

By forming the on-chip lenses having different shapes as described above, it is possible to also acquire a phase difference from an analog signal acquired in the pixel 20.

Figure 25:
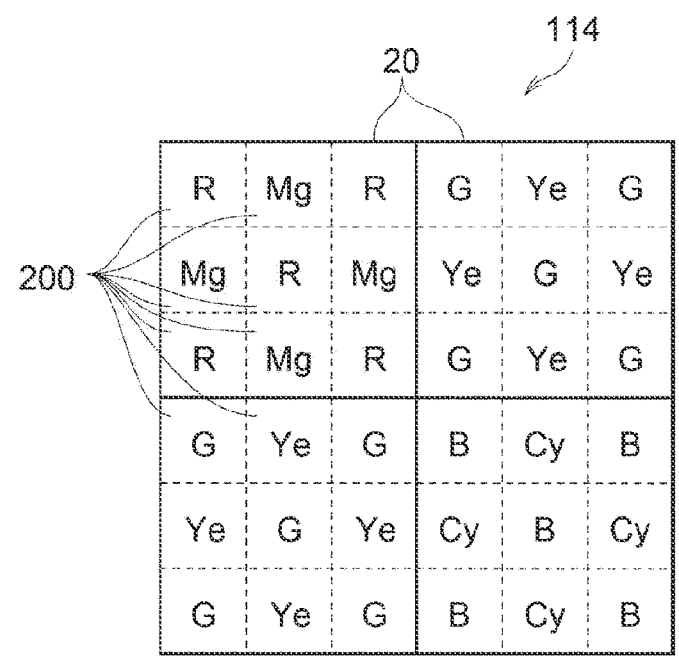
FIG. 25 is a diagram illustrating an example of formation of the pixel according to an embodiment.

FIG. 25 is a diagram illustrating still another example of dividing the pixel 20. As illustrated in FIG. 25, the pixel 20 may be divided into 3×3 divided pixels. In this case, the three-primary color system with low sensitivity may be assigned to five pixels, and the complementary color system may be assigned to the remaining four pixels. By assigning the colors as described above, it is possible to balance the sensitivity after pixel values are added to some extent. Moreover, the number of divided pixels is not limited to 3×3, and may be 4×4 or 5×5.

The addition of the pixel values may be executed at a timing of acquiring an analog signal in the floating diffusion as described in the above embodiment, or may be executed by an analog circuit, or a digital circuit after A/D conversion, as another example.

In a case where divided pixels are used, output values from the divided pixels acquired for each frame may be added. In such a case, the number of pixels to be added may be changed for each frame. This can also be applied to each pixel 20 instead of the divided pixel. Such control also leads to generation of an image with higher reproducibility on the basis of a frame rate.

Sixth Embodiment

In the present embodiment, a semiconductor chip including an imaging element 114 will be briefly described.

Figure 26:
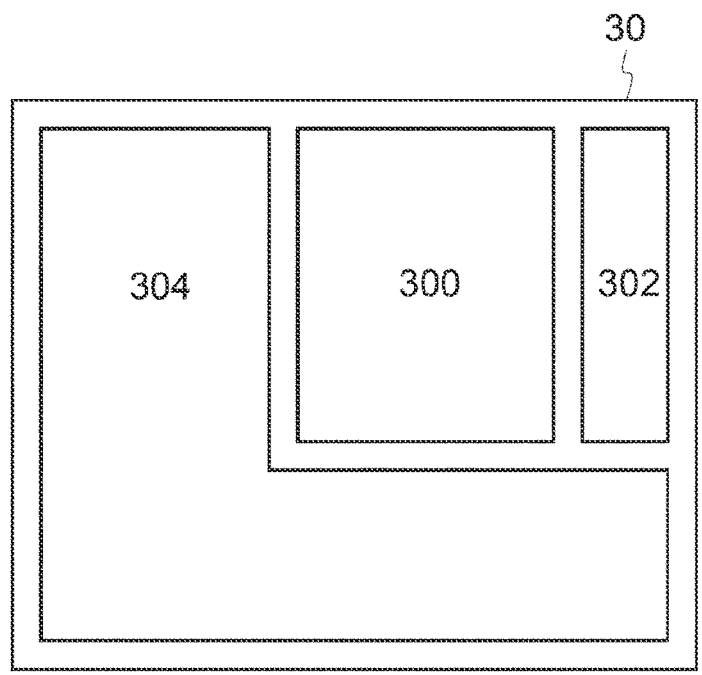
FIG. 26 is a view illustrating an example of a substrate configuration according to an embodiment.

FIG. 26 is a diagram illustrating an example of a board including the imaging element 114. A board 30 includes a pixel region 300, a control circuit 302, and a logic circuit 304. As illustrated in FIG. 26, the pixel region 300, the control circuit 302, and the logic circuit 304 may be provided on the same board 30.

The pixel region 300 is, for example, a region including the pixels 20 and the like in each of the above-described embodiments. In the signal processing unit 106, A/D conversion and the like may be appropriately provided in the pixel region 300, or may be provided in another region (not illustrated) in the board 30. The control circuit 302 includes the control unit 104 in FIG. 1. The logic circuit includes, for example, a circuit after A/D conversion in the signal processing unit 106 and the image processing unit 108. Furthermore, at least a part of the signal processing unit 106 and the image processing unit 108 may be mounted not on this chip but on another signal processing chip provided at a location different from the board 30, or may be mounted in another processor or the like.

Figure 27:
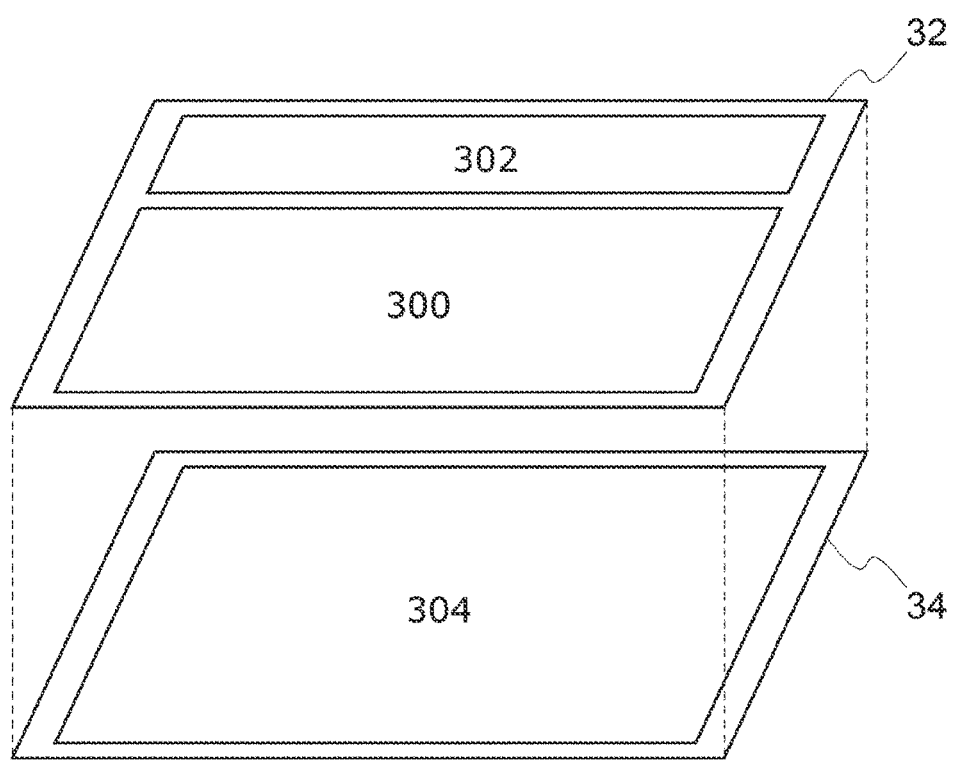
FIG. 27 is a view illustrating an example of a substrate configuration according to an embodiment.

FIG. 27 is a diagram illustrating another example of a board including the imaging element 114. As the board, a first board 32 and a second board 34 are provided. The first board 32 and the second board 34 have a stacked structure, and can appropriately transmit and receive signals to and from each other via a connection portion such as a via hole. For example, the first board 32 may include the pixel region 300 and the control circuit 302, and the second board 34 may include the logic circuit 304.

Figure 28:
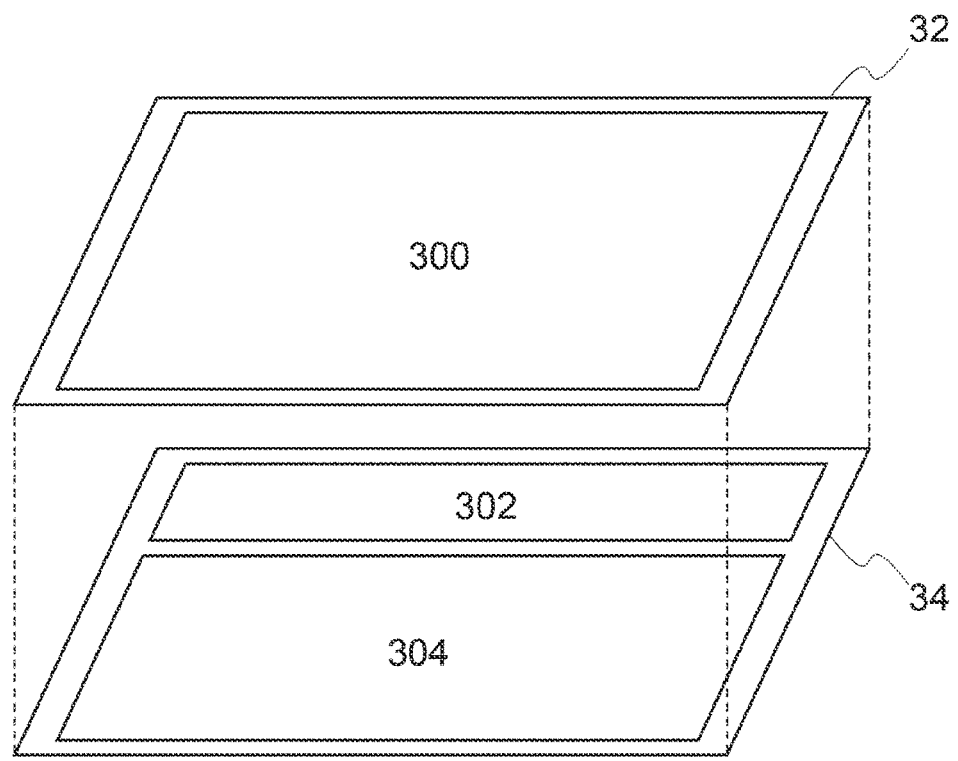
FIG. 28 is a view illustrating an example of a substrate configuration according to an embodiment.

FIG. 28 is a diagram illustrating still another example of a board including the imaging element 114. As the board, a first board 32 and a second board 34 are provided. The first board 32 and the second board 34 have a stacked structure, and can appropriately transmit and receive signals to and from each other via a connection portion such as a via hole. For example, the first board 32 may include the pixel region 300, and the second board 34 may include the control circuit 302 and the logic circuit 304.

The boards stacked in FIGS. 27 and 28 may be connected to each other through a via hole as described above, or may be connected to each other by using a method such as a micro dump. The boards can be stacked by using any method such as chip on chip (CoC), chip on wafer (CoW), or wafer on wafer (WoW).

Seventh Embodiment

Figure 29:
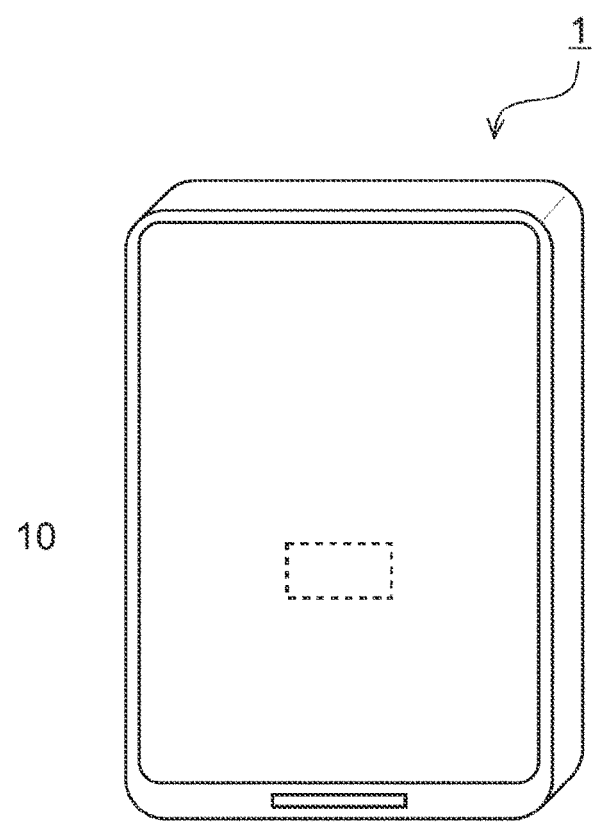
FIG. 29 is a schematic diagram illustrating an example of an electronic apparatus including the solid-state imaging device according to an embodiment.

FIG. 29 is a diagram illustrating an example of an electronic apparatus 1. As illustrated in this drawing, the electronic apparatus 1 may be, for example, a smartphone or a tablet terminal. As described above, in a case where the electronic apparatus 1 includes a display as a display unit that displays an image or a video, the solid-state imaging device 10 that captures light through the display may be provided to overlap with the display.

With the configuration of the pixel 20 as described in each of the above-described embodiments, it is possible to appropriately receive light transmitted through the display. For example, a material such as polyimide that absorbs a large amount of blue light may be used for a display in a smartphone or the like. Also in such a case, by including the solid-state imaging device 10 capable of receiving light of five or more colors including at least three primary colors and complementary colors, light having an appropriate spectrum can be received, and color reproducibility of an image can be improved.

Furthermore, in the above description, the solid-state imaging device 10 is provided below the display, but the present disclosure is not limited thereto. For example, in a smartphone or the like, the solid-state imaging device 10 described in each of the above-described embodiments may be provided as a so-called out-camera regardless of the display.

FIG. 30 is a diagram illustrating another example of the electronic apparatus 1. The electronic apparatus 1 may be, for example, an xR terminal such as a virtual reality (VR) terminal, an augmented reality (AR) terminal, or a mixed reality (MR) terminal. The solid-state imaging device 10 may be used as a camera mounted on such an xR terminal. By using the solid-state imaging device 10 as a camera, sensitivity and color reproducibility can be improved, and thus immersion felt by a user can be further improved.

Furthermore, in addition to this, it is also possible to utilize the solid-state imaging device 10 for a user interface (UI) for recognizing an object or the like that a user is interested in by performing object identification.

Still furthermore, the solid-state imaging device 10 can also be used for health care sensing of a wearable terminal. For example, it is also possible to acquire vital information such as oxygen saturation in blood by viewing a sensitivity ratio between R and IR. The acquired vital information is stored as a database, and can be used for healthcare or the like together with daily accurate face color. As another example, it is also possible to perform a process of updating a neural network model each time vital information is acquired and to apply the solid-state imaging device 10 to healthcare or the like by using the neural network model. This application can also be applied to medical devices such as capsule endoscopes.

According to each of the embodiments described above, the solid-state imaging device 10 can achieve high sensitivity by using complementary colors and high color reproducibility due to multicoloring by combining the complementary colors and primary colors. Furthermore, in some embodiments, it is also possible to combine primary colors and complementary colors without a centroid shift.

For example, in a case where the electronic apparatus 1 is a smartphone or the like and an image is shared on an SNS or the like, not only faithful color reproducibility but also color performance and the like may be required. Even in such a case, according to the embodiments of the present disclosure, it is possible to increase the degree of freedom of color adjustment and change color production according to an object recognition result.

Furthermore, as illustrated in FIG. 29, in a system and a device in which a camera is provided below a display, a light quantity may be blocked by a display panel or the like, and particularly, sensitivity of blue may be significantly deteriorated. However, according to the embodiments of the present disclosure, these problems can be solved.

Furthermore, since primary colors and complementary colors can be obtained in the vertical direction (for example, in the height direction of the drawings in FIGS. 16 and 17) by using the organic photoelectric conversion film, it is possible to suppress adverse effects such as the occurrence of resolution deterioration due to addition of complementary colors.

Eighth Embodiment

In the above embodiments, the reproducibility of a color or the like has been described, but it is also possible to improve the accuracy of light source estimation and object recognition or to correct flickering of an image by applying this.

Figure 31:
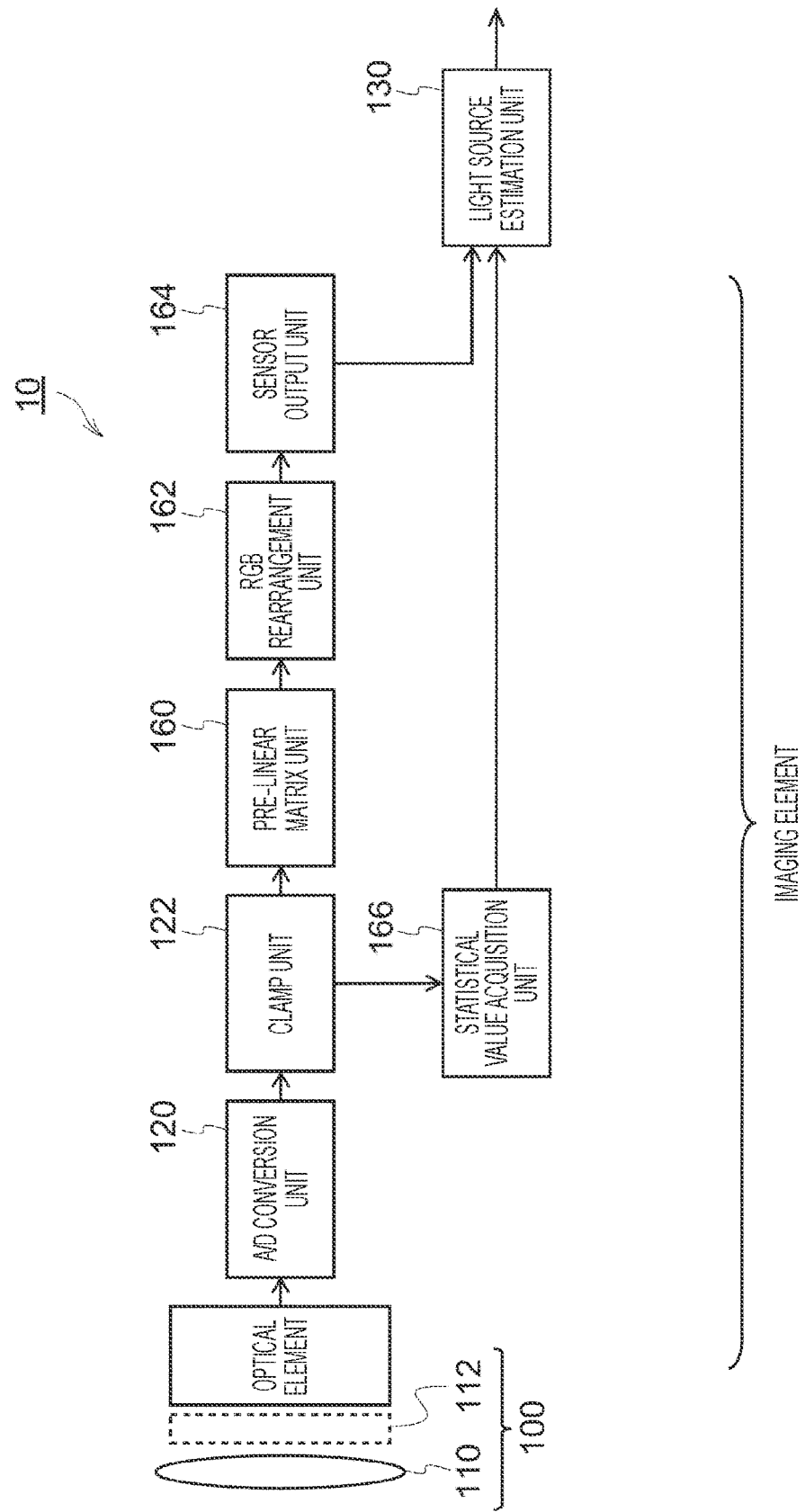
FIG. 31 is a diagram illustrating an example of a block diagram of the solid-state imaging device according to an embodiment.

FIG. 31 is a block diagram illustrating still another example of the solid-state imaging device 10. The solid-state imaging device 10 further includes a pre-linear matrix unit 160, an RGB rearrangement unit 162, a sensor output unit 164, and a statistical value acquisition unit 166 in the configuration in FIG. 2 and the like.

Figure 32:
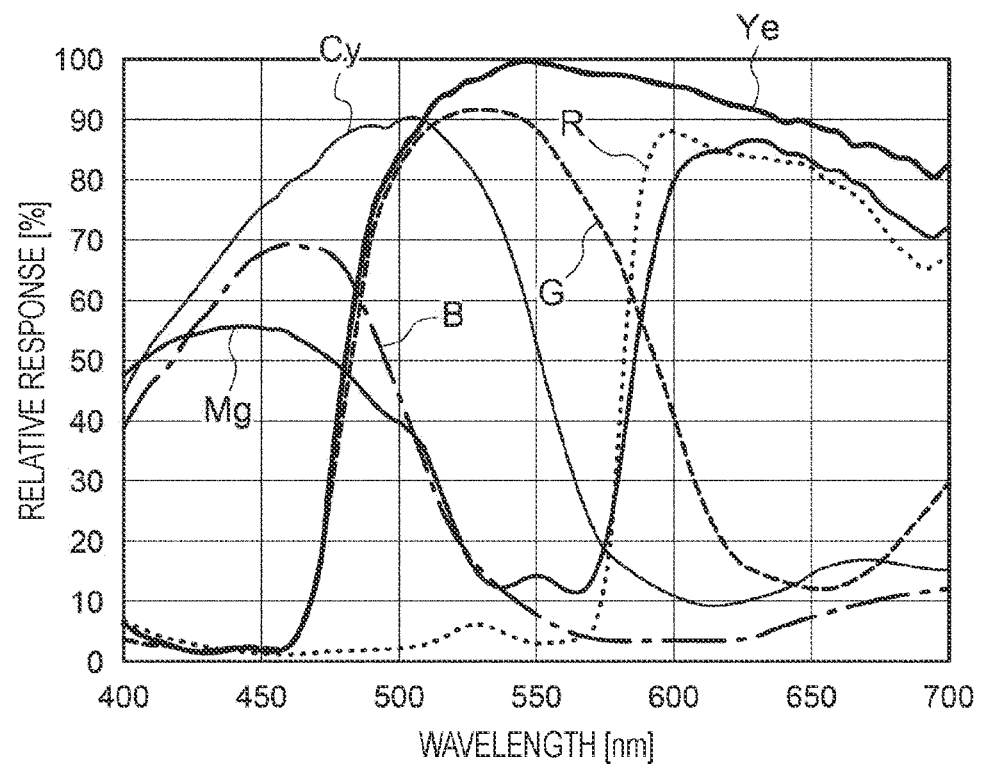
FIG. 32 is a diagram illustrating a spectrum configuring an input of a pre-linear matrix unit according to an embodiment.

FIG. 32 is a diagram illustrating acquired RGB information and acquired CMY information in a spectrum. In the present embodiment, for example, a light receiving element that receives light of six colors of RGB+CMY as illustrated in FIG. 32 is used, but the present disclosure is not limited to these six colors.

Similarly to the above-described embodiments, the light receiving element receives light and outputs an analog signal based on the intensity, and the analog signal is converted into a digital signal by the A/D conversion unit 120. The clamp unit 122 performs black level correction.

The pre-linear matrix unit 160 mixes the first information and the second information on the basis of the information output from the clamp unit 122, and acquires, for example, information of RGB pixel values different from the RGB information received by the light receiving element. As described above, the pre-linear matrix unit 160 recalculates the RGB information according to a predetermined arithmetic process.

The RGB rearrangement unit 162 rearranges signals output from the pre-linear matrix unit 160.

Figure 33:
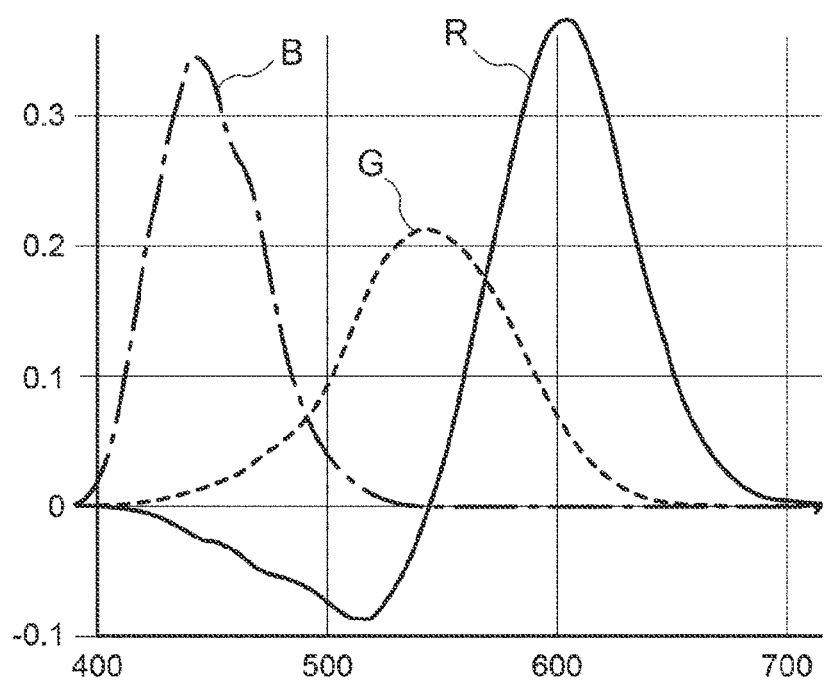
FIG. 33 is a diagram illustrating a spectrum configuring rearranged RGB signals according to an embodiment.

FIG. 33 is a diagram illustrating a color-matching function in the RGB color system. The RGB information output from the pre-linear matrix unit 160 and the RGB rearrangement unit 162 is information in which an SNR or color reproducibility is improved compared with the first information and the second information. Furthermore, the RGB information may be RGB information as illustrated in FIG. 33 converted into a spectral output close to a color matching function that is said to be ideal for color reproducibility by using complementary color information. That is, the pre-linear matrix unit 160 generates RGB color information in which an SNR or the like is increased from color information of five or more colors prior to other processing. Then, the solid-state imaging device 10 executes subsequent processing on the basis of this information.

For example, a signal processing processor in a subsequent stage of the imaging element 114 is generally mounted to handle information of three colors of RGB. In such a case, by outputting a digital signal as an RGB signal as in the present embodiment, it is possible to support many subsequent signal processing processors. Then, since the RGB signal is a signal with improved SNR characteristics and the like as described above, it is possible to use a general signal processing circuit while using data with better color reproducibility.

The sensor output unit 164 outputs the image signals rearranged by the RGB rearrangement unit 162.

The statistical value acquisition unit 166 acquires statistical values of color information of five or more colors. The acquired information is used, for example, to improve accuracy of light source estimation and object recognition. For example, the light source estimation unit 130 can reproduce a spectrum of a light source with higher accuracy on the basis of the statistical values of five or more colors, and can acquire information regarding an environment or the like based on the reproduced spectrum. The object recognition unit 132 can also improve the recognition accuracy of an object, a living body, or the like on the basis of the statistical values.

Specifically, the statistical value acquisition unit 166 divides the inside of an angle of view into regions, and outputs an average value of each color for each region. For example, an average value of pixel values in a specific region is output. Since the information obtained as described above is detailed color information using information of the six colors, the information can be used for light source estimation or color correction. The color correction means, for example, overall processing of adjusting a color when executing optimum image creation in a processor in a subsequent stage.

Note that, although the statistical values of the six colors are acquired, the RGB information can also be output from the RGB rearrangement unit 162 or the like as normal imaging data, and thus statistical values of only CMY may be output.

Furthermore, in the region division, a plurality of pixels is included in the region, but the present disclosure is not limited thereto, and the region may be one pixel. For example, while the RGB information is converted into RGB information subjected to processing of an SNR or the like through pre-linear matrix processing, CMY is lost at this stage, and thus the statistical value acquisition unit 166 may output CMY information to transmit the information to the light source estimation unit 130 or the like in the subsequent stage.

Outputs of the sensor output unit 164 and the statistical value acquisition unit 166 are output to, for example, the light source estimation unit 130 as output information of the imaging element 114. The subsequent processing may be similar to that in the above embodiments. Furthermore, as another example, white balance adjustment or linear matrix control may be performed after light source estimation. Moreover, light source estimation, white balance adjustment, and linear matrix processing may also be executed in the imaging element 114.

As described above, according to the present embodiment, it is possible to output more information to the processor in the subsequent stage compared with the above-described embodiments. By using a large amount of information, a process of improving an SNR and color reproduction can be easily added. As described above, it is possible to increase the SNR, further increase the accuracy of light source estimation, and further increase the accuracy of recognition of an object and a living body.

In the solid-state imaging device 10 having this configuration, a process of acquiring the first information and the second information in FIGS. 8 and 9 is executed, and information of five or more colors is converted into RGB information at a high SNR. The control unit 104 can also change a shutter speed in the first information acquisition and the second information acquisition. By changing the shutter speed, flickering in the RGB image acquired in the pre-linear matrix unit 160 can be corrected.

For example, in FIGS. 8 and 9, in a case where there is a light source or the like that is periodically turned on, when this cycle is the same as or close to a cycle of switching between the state in FIG. 8 and the state in FIG. 9, flickering occurs in the entire image. Furthermore, even in a case where a general complementary MOS (CMOS) element or the like is used, flickering may occur due to a cause similar to rolling shutter distortion or the like. Even in such a case, by acquiring information at different timings or at different shutter speeds in the same pixel 20, these timings can be shifted. As a result, for example, flickering in an image such as flickering caused by a light source such as an LED can be suppressed.

Ninth Embodiment

A case where the electronic apparatus 1 as illustrated in FIG. 29 is an under display camera (UDC) in which a camera is disposed below a display and includes the solid-state imaging device 10 will be described in more detail. In such a case, the accuracy of imaging can be improved by using the form using the compound-eye camera in the above-described embodiment.

Figure 34:
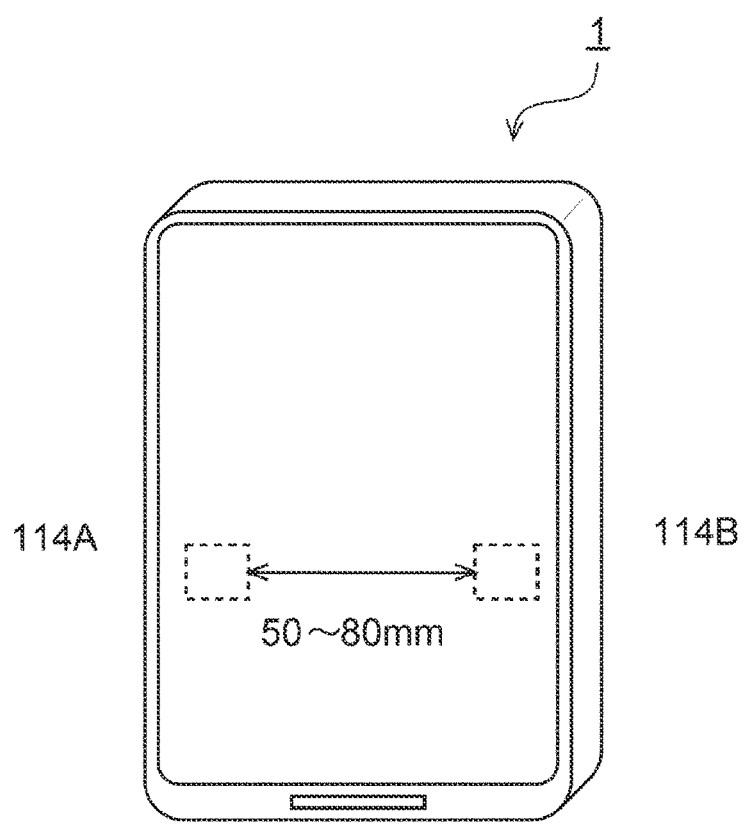
FIG. 34 is a diagram illustrating an electronic apparatus according to an embodiment.

FIG. 34 is a diagram illustrating disposition of the electronic apparatus 1 according to the present embodiment and the imaging element 114 of the solid-state imaging device 10. The solid-state imaging device 10 includes imaging elements 114A and 114B. For example, in a case where an image used for virtual reality (VR)/augmented reality (AR)

or the like is acquired, a distance of a center point between these imaging elements is desirably 50 to 80 mm at which parallax equivalent to that of human eyes can be maintained. However, the present disclosure is not limited thereto, and these imaging elements may be disposed closer to each other or may be disposed farther from each other. For example, among the pixels belonging to the respective imaging elements, the closest pixels may be separated by a distance of 10 mm or less.

Figure 35:
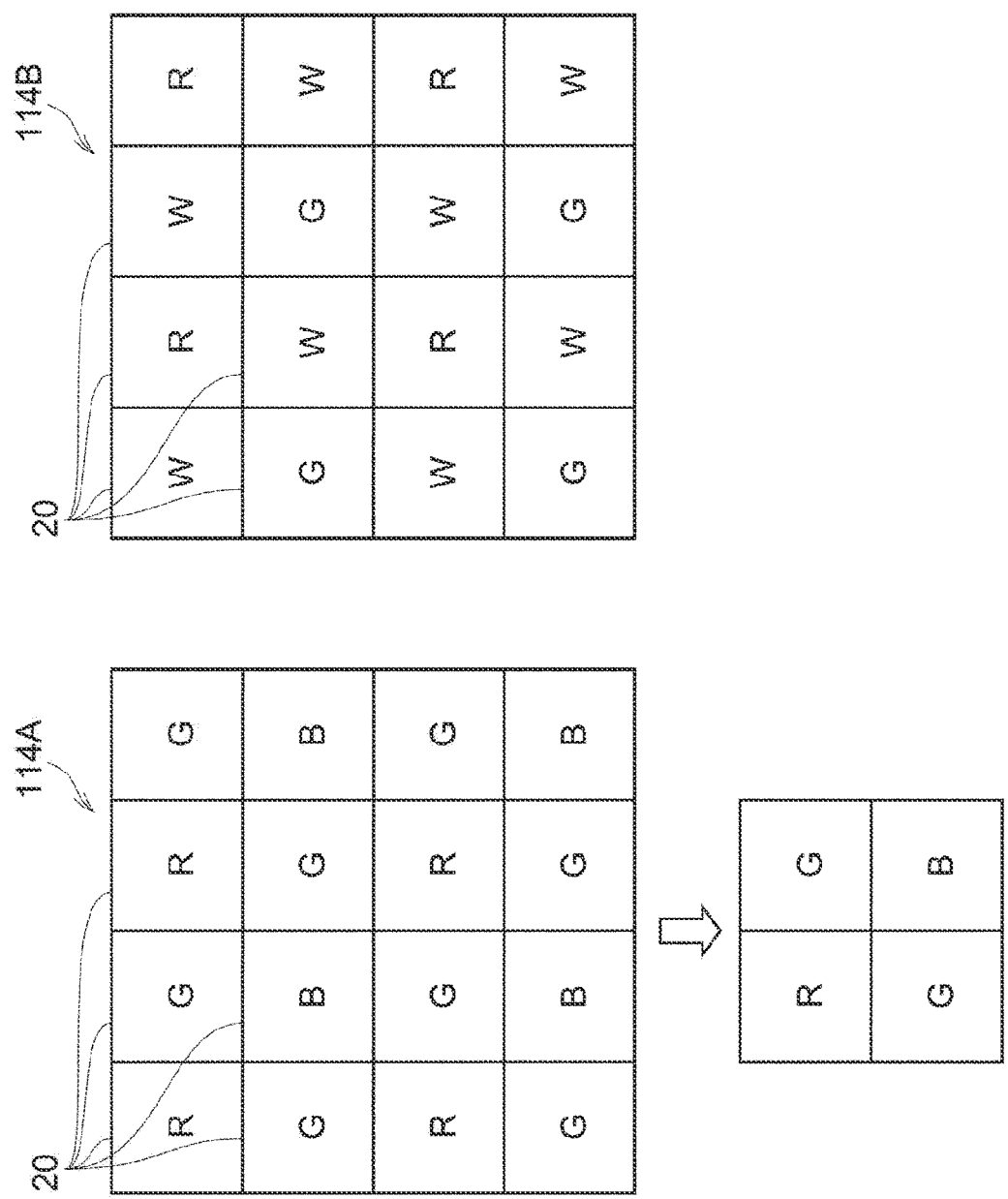
FIG. 35 is a diagram illustrating an array of colors of light received in the pixel according to an embodiment.

FIG. 35 illustrates an arrangement example of colors of the pixels 20 in each of the imaging elements 114A and 114B. As described above, the solid-state imaging device 10 according to the present embodiment includes the imaging element 114A that acquires the first information with a low sensitivity and the imaging element 114B that acquires the second information with a high sensitivity. Hereinafter, the pixels 20 included in the imaging element 114A will also be referred to as a first pixel group, and the pixels 20 included in the imaging element 114B will also be referred to as a second pixel group.

An array of the pixels 20 belonging to the first pixel group is, for example, an RGB Bayer array, and an array of the pixels 20 belonging to the second pixel group is, for example, an RGW array.

In a case of a still image, it is possible to realize highly accurate color reproduction by acquiring the first information and the second information from all the pixels 20 and executing demosaic and color combining processes. On the other hand, in a case of a moving image, information acquired from the imaging element 114A is reduced to an RGB Bayer array as indicated by an arrow. By adding color information of the reduced first information with a low sensitivity to the second information on the high-sensitivity side, the color reproducibility can be improved while maintaining a high frame rate.

In this case, since an amount of information to be acquired as the first information can be reduced, power consumption can be suppressed compared with a case of acquiring information with a resolution similar to that of the still image. As an example, the sensitivity of at least one of the RGW pixels 20 in the second pixel group may be set higher than the sensitivity of the G pixel 20 in the first pixel group. With this setting, the sensitivity of the second information can be made higher than the sensitivity of the first information.

Furthermore, the sensitivity may be set higher than the sensitivity of R or the sensitivity of B instead of the sensitivity of G. For example, as will be described later, the Cy or W pixel 20 having a sensitivity higher than the sensitivity of B in the first pixel group is provided in the second pixel group, and thus the sensitivity of blue can be improved even in a case where the imaging element 114 is provided below the display as illustrated in FIG. 34.

As described above, different combining methods may be used at the time of capturing a moving image and at the time of capturing a still image. As a result, it is possible to solve a problem of power consumption at the time of capturing a moving image, a problem of real-time property, or the like.

Note that, in FIG. 34, the sizes of both the imaging elements 14 (sensors) are the same, but the sensor on the high sensitivity side, that is, the imaging element 114B side to which the second pixel group belongs may be larger. For example, by changing the size of the sensor as described above, in a case where it is difficult to use both sensors, switching of control of the solid-state imaging device 10 may be performed such that only the sensor on the high sensitivity side is used.

In the signal processing unit 106 or the image processing unit 108, the color reproducibility is improved by adding (weighting addition) the first information acquired from the first pixel group to the second information acquired from the second pixel group. In a case where the resolution of the first pixel group is lower than that of the second pixel group, the first information may be generated by performing a demosaic process on the basis of an analog signal acquired from the first pixel group, and the first information and the second information may be subjected to an addition process. This is common to still images and moving images.

On the other hand, the same applies to a case of reducing an information amount of the first pixel group in a moving image. Also in this case, by demosaicing information acquired from the first pixel group, it is possible to interpolate the second information and reconstruct an image with a high resolution and improved color reproducibility. Moreover, the addition can reduce the influence of noise, which also contributes to improvement of an SNR.

In the above description, the high sensitivity side is allocated to the RGW array, but may be allocated to the complementary color system similarly to the above-described embodiments. For example, a form similar to that of the imaging element 114B illustrated in FIGS. 12 to 15 may be employed.

Figure 36:
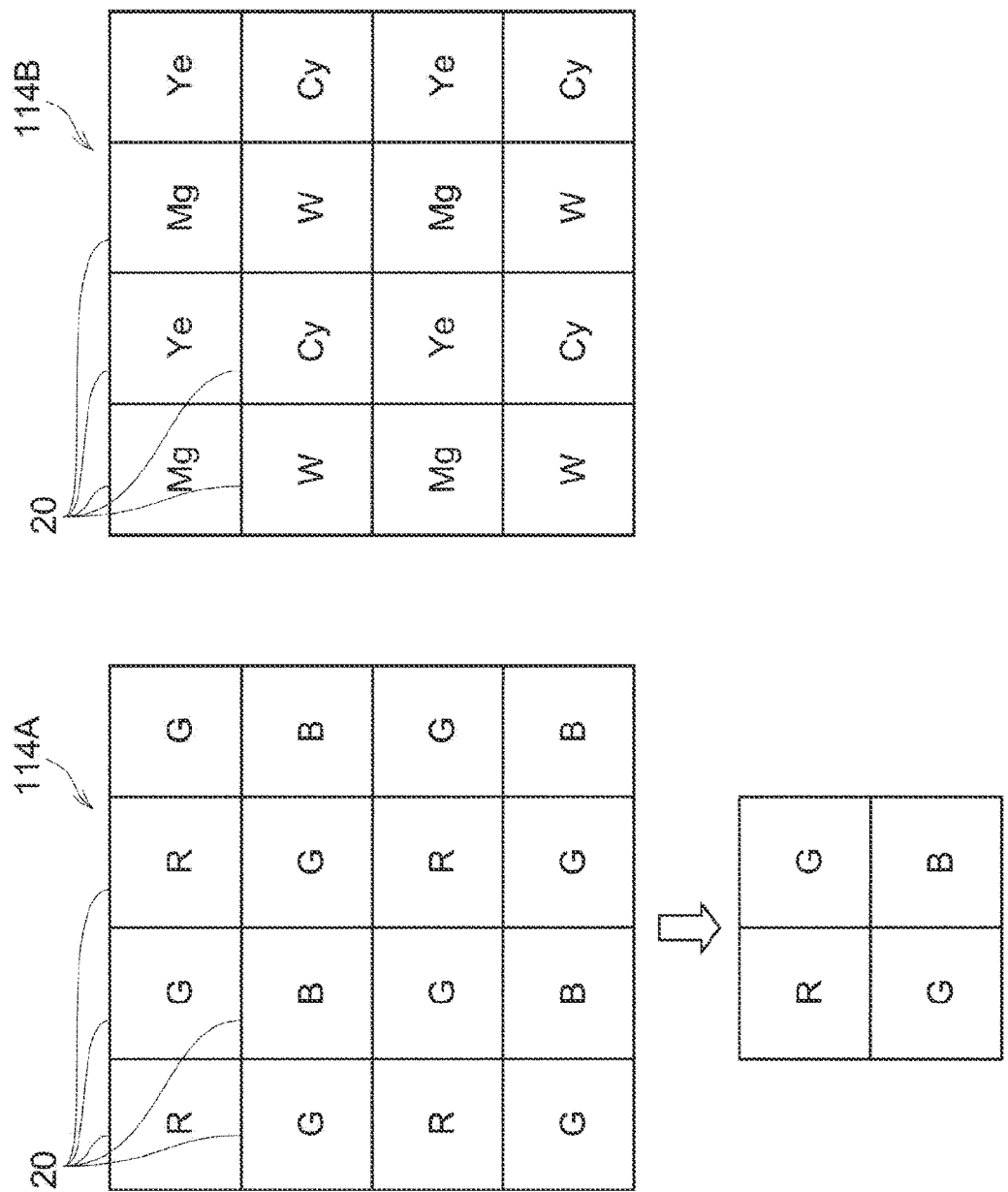
FIG. 36 is a diagram illustrating an array of colors of light received in the pixel according to an embodiment.

FIG. 36 is a diagram illustrating another example of a pixel array in the imaging element 114B. The second pixel group may have a form of the complementary color system+W as illustrated in the drawing. Similarly to the above description, the solid-state imaging device 10 adds the first information obtained by appropriately converting a signal acquired from the first pixel group to the second information acquired from the second pixel group, and outputs the addition result, and thus at least one effect of color reproducibility, a high resolution, or a high SNR can be achieved.

The IR component may be acquired on the basis of information acquired from the W pixel 20. Similarly to the above description, by acquiring the IR component, it is also possible to contribute to improvement in accuracy of light source estimation and object recognition.

Furthermore, similarly to the above-described embodiments, a timing of combining the first information and the second information may be changed at the time of capturing a moving image and at the time of capturing a still image. Similarly, a block for performing a process at the time of capturing a moving image and a block for performing a process at the time of capturing a still image may have different configurations. As described above, at the time of capturing a moving image, data may be acquired and an image may be reconfigured in a more high-performance server apparatus or the like. That is, upon capturing a moving image and capturing a still image, the subsequent processes may be executed in different system blocks.

Also in the present embodiment, as illustrated in FIG. 31, a statistical value or the like of color information may be acquired. The color information of the second information may be corrected by using the statistic. As another example, a statistic regarding a color may be acquired from a signal acquired from the first pixel group, and the second information acquired from the second pixel group may be corrected on the basis of the statistic.

Similarly to the above-described embodiments, the divided pixels may be color-coded instead of the pixels 20 being color-coded. The divided pixels may be applied to only one of the first pixel group or the second pixel group, or may be applied to both of the first pixel group and the second pixel group. That is, at least one of the divided pixels may receive W light.

Furthermore, in the array, any one pixel or divided pixel may exclusively acquire IR light. An application of IR light is similar to that described above. In the imaging element 114 that acquires the IR light, it is desirable that the IRCF is not provided similarly to the above-described embodiments. Moreover, an IRCF may be separately provided for elements other than the pixels 20 or the divided pixels that acquire IR light.

Furthermore, optical systems of the first pixel group and the second pixel group may be different from each other. For example, by making an optical size of the second pixel group larger than an optical size of the first pixel group, it is possible to acquire a more detailed signal on the high sensitivity side and to perform driving at a higher speed and lower power consumption on the low sensitivity side.

(Application Examples of Electronic Apparatus 1 or Solid-State Imaging Device 10 According to Present Disclosure)

First Application Example

Figure 37A:
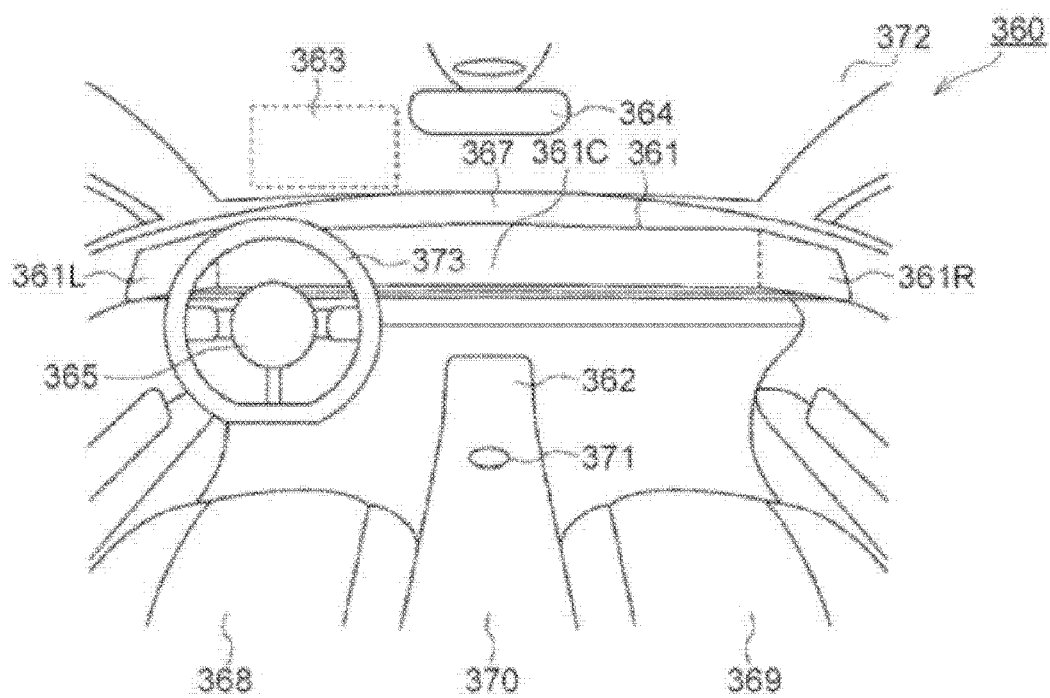
FIG. 37A is a diagram illustrating an internal state of a vehicle from a rear side to a front side of the vehicle.
Figure 37B:
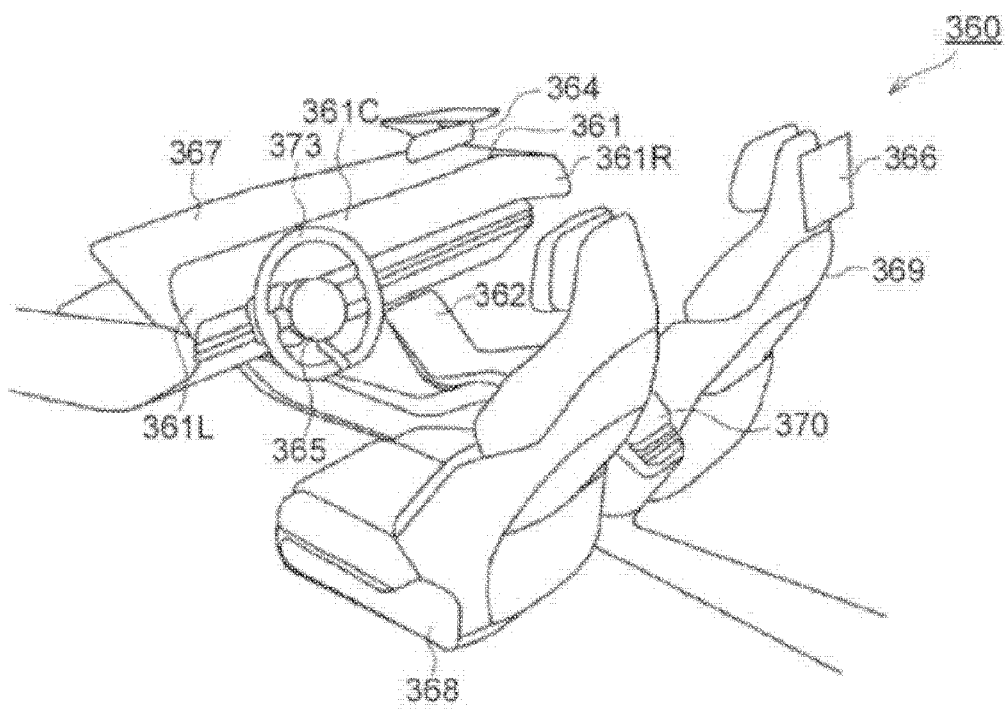
FIG. 37B is a diagram illustrating an internal state of the vehicle from an oblique rear to an oblique front of the vehicle.

The electronic apparatus 1 or the solid-state imaging device 10 according to the present disclosure can be used for various purposes. FIGS. 37A and 37B are diagrams illustrating an internal configuration of a vehicle 360 as a first application example of the electronic apparatus 1 including the solid-state imaging device 10 according to the present disclosure. FIG. 37A is a diagram illustrating an internal state of the vehicle 360 from a rear side to a front side of the vehicle 360, and FIG. 37B is a diagram illustrating an internal state of the vehicle 360 from an oblique rear side to an oblique front side of the vehicle 360.

The vehicle 360 in FIGS. 37A and 37B has a center display 361, a console display 362, a head-up display 363, a digital rear mirror 364, a steering wheel display 365, and a rear entertainment display 366.

The center display 361 is disposed on a dashboard 367 at a position facing a driver's seat 368 and a passenger seat 369. FIG. 37 illustrates an example of the center display 361 having a horizontally long shape extending from the driver's seat 368 side to the passenger seat 369 side, but a screen size or a disposition location of the center display 361 is freely selected. The center display 361 can display information detected by various sensors. As a specific example, the center display 361 may display a captured image that is captured by the imaging sensor, a distance image to an obstacle in front of or on a side of the vehicle measured by a ToF sensor, a passenger's body temperature detected by an infrared ray sensor, and the like. The center display 361 may be used to display, for example, at least one of safety-related information, operation-related information, a life log, health-related information, authentication/identification-related information, or entertainment-related information.

The safety-related information is information such as doze detection, looking-away detection, mischief detection of a child riding together, the presence or absence of wearing of a seat belt, and detection of leaving of an occupant, and is, for example, information detected by sensors disposed to overlap the back side of the center display 361. The operation-related information is information obtained by detecting a gesture related to an operation of the occupant by using the sensor. Detected gestures may include an operation of various equipment in the vehicle 360. For example, operations of an air conditioner, a navigation device, an AV device, a lighting device, and the like are detected. The life log includes a life log of all the occupants. For example, the life log includes an action record of each occupant in the vehicle. By acquiring and storing the life log, it is possible to check a state of the occupant at the time of an accident. The health-related information is information obtained by detecting the body temperature of the occupant by using a temperature sensor, and estimates a health condition of the occupant on the basis of the detected body temperature. Alternatively, the face of the occupant may be imaged by using an image sensor, and a health condition of the occupant may be estimated from the imaged facial expression. Moreover, a conversation may be made with the occupant in an automatic voice, and a health condition of the occupant may be estimated on the basis of the answer content of the occupant. The authentication/identification-related information includes a keyless entry function of performing face authentication by using the sensor, an automatic adjustment function of a sheet height or a position through face identification, and the like. The entertainment-related information includes a function of detecting operation information of the AV device by the occupant by using the sensor, a function of recognizing the face of the occupant by the sensor and providing content suitable for the occupant from the AV device, and the like.

The console display 362 may be used to display the life log information, for example. The console display 362 is disposed near a shift lever 371 of the center console 370 between the driver's seat 368 and the passenger seat 369. The console display 362 can also display information detected by various sensors. Furthermore, the console display 362 may display an image of the periphery of the vehicle captured by the image sensor, or may display a distance image to an obstacle in the periphery of the vehicle.

The head-up display 363 is virtually displayed behind a windshield 372 in front of driver's seat 368. The head-up display 363 may be used to display, for example, at least one of the safety-related information, the operation-related information, the life log, the health-related information, the authentication/identification-related information, or the entertainment-related information. The head-up display 363 is virtually disposed in front of the driver's seat 368 in many cases, and is thus suitable for displaying information directly related to an operation of the vehicle 360 such as a speed of the vehicle 360 or a remaining amount of fuel (battery).

The digital rear mirror 364 can not only display the rear of the vehicle 360 but also display a state of the occupant in the rear seat, and can thus be used to display the life log information, for example, by disposing a sensor overlapping the back surface side of the digital rear mirror 364.

The steering wheel display 365 is disposed near the center of the steering wheel 373 of the vehicle 360. The steering wheel display 365 may be used to display, for example, at least one of the safety-related information, the operation-related information, the life log, the health-related information, the authentication/identification-related information, or the entertainment-related information. In particular, the steering wheel display 365 is close to the driver's hand, and is thus suitable for displaying the life log information such as the body temperature of the driver, or for displaying information related to an operation of the AV device, the air conditioner, or the like.

The rear entertainment display 366 is attached to the back side of the driver's seat 368 or the passenger seat 369, and is used for the occupant's viewing in the rear seat. The rear entertainment display 366 may be used to display, for example, at least one of the safety-related information, the operation-related information, the life log, the health-related information, the authentication/identification-related information, or the entertainment-related information. In particular, the rear entertainment display 366 is in front of the occupant in the rear seat and thus displays information related to the occupant in the rear seat is displayed. For example, information regarding an operation of the AV device or the air conditioner may be displayed, or a result of measuring the body temperature or the like of the occupant in the rear seat by using the temperature sensor may be displayed.

As described above, disposing the sensor overlapping the rear surface side of the electronic apparatus 1 makes it possible to measure a distance to an object present in the surroundings. Optical distance measurement methods are roughly classified into a passive type and an active type. The passive type involves measuring a distance by receiving light from an object without projecting light from a sensor to the object. The passive type includes a lens focus method, a stereo method, a monocular vision method, and the like. The active type involves projecting light onto an object and receiving reflected light from the object with a sensor to measure a distance. Examples of the active type include an optical radar method, an active stereo method, an illuminance difference stereo method, a moiré topography method, and an interference method. The electronic apparatus 1 according to the present disclosure is applicable to any of these distance measurement methods. By using the sensor disposed to overlap the rear surface side of the electronic apparatus 1 according to the present disclosure, the above-described passive type or active type distance measurement can be performed.

Second Application Example

The electronic apparatus 1 including the solid-state imaging device 10 according to the present disclosure is applicable not only to various displays used in vehicles but also to displays mounted on various electronic apparatuses.

Figure 38A:
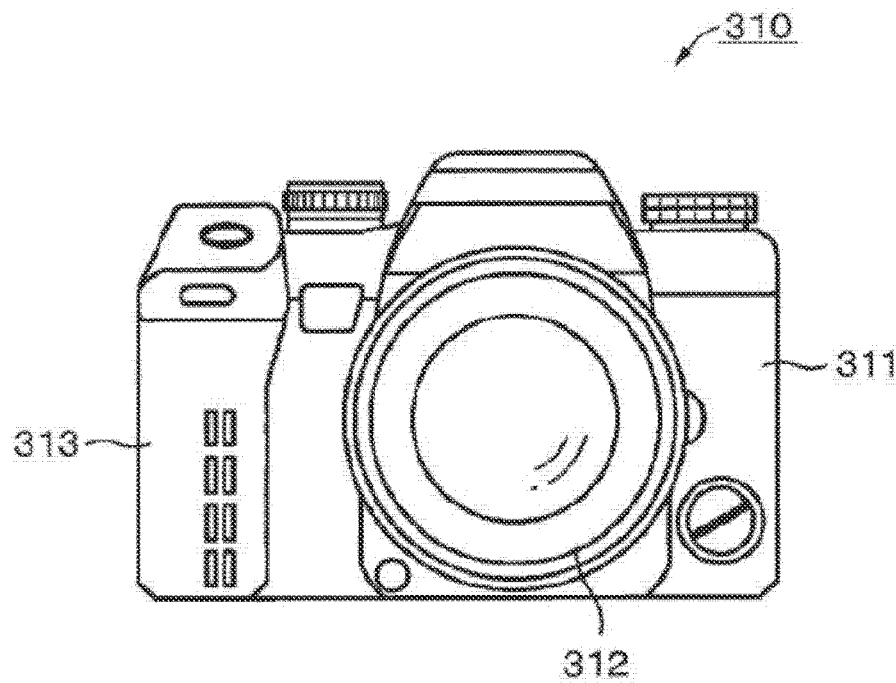
FIG. 38A is a front view of a digital camera that is a second application example of the electronic apparatus.
Figure 38B:
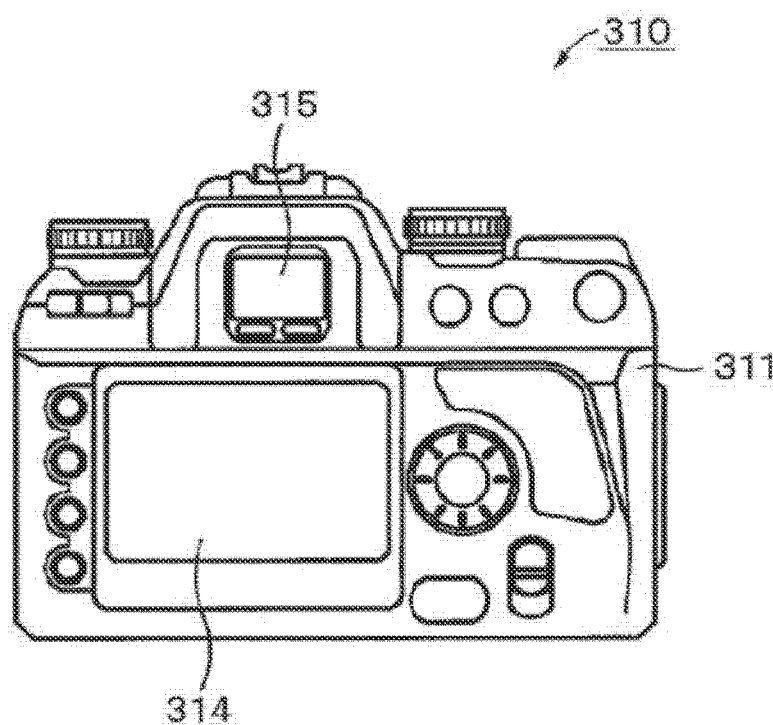
FIG. 38B is a rear view of the digital camera.

FIG. 38A is a front view of a digital camera 310 as a second application example of electronic apparatus 1, and FIG. 38B is a rear view of the digital camera 310. The digital camera 310 in FIGS. 38A and 38B illustrates an example of a single-lens reflex camera in which a lens 121 is replaceable, but is also applicable to a camera in which the lens 121 is not replaceable.

In the camera in FIGS. 38A and 38B, when a photographer looks into an electronic viewfinder 315 to determine a composition while holding a grip 313 of a camera body 311, and presses a shutter while adjusting the focus, imaging data is stored in a memory of the camera. As illustrated in FIG. 38B, a monitor screen 316 that displays imaging data and the like or a live image and the like, and the electronic viewfinder 315 are provided on the back side of the camera. Furthermore, a sub-screen displaying setting information such as a shutter speed and an exposure value may be provided on the upper surface of the camera.

The electronic apparatus 1 according to the present disclosure can be used by disposing a sensor on the rear surface side of the monitor screen 316, the electronic viewfinder 315, the sub-screen, or the like used for a camera in an overlapping manner.

Third Application Example

The electronic apparatus 1 according to the present disclosure is also applicable to a head mounted display (hereinafter, referred to as an HMD). The HMD may be used for VR, AR, mixed reality (MR), substitutional reality (SR), or the like.

Figure 39A:
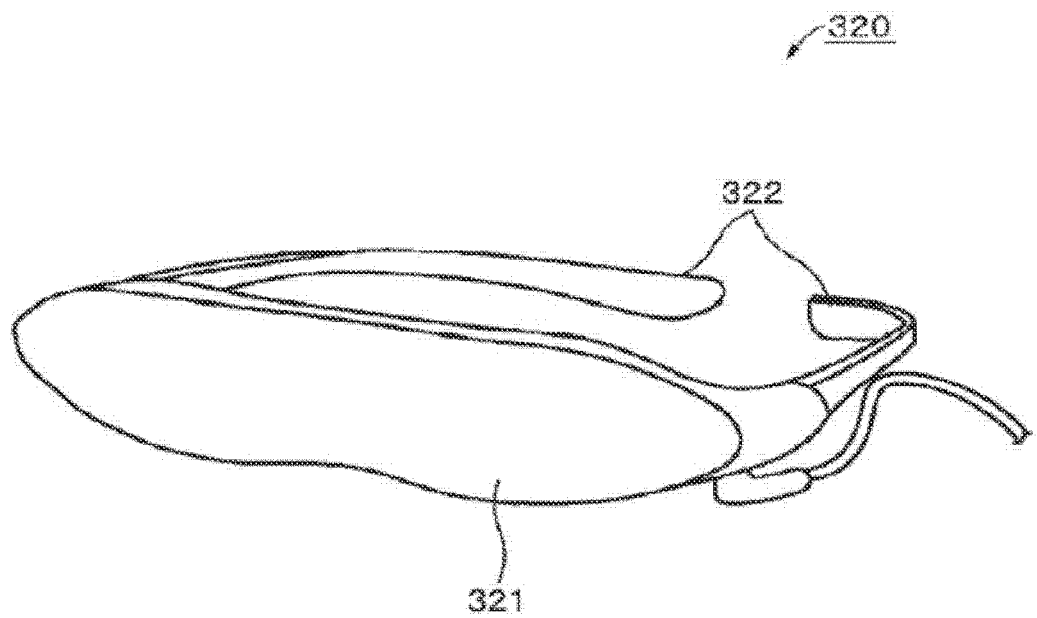
FIG. 39A is an external view of an HMD that is a third application example of the electronic apparatus.

FIG. 39A is an external view of an HMD 320 as a third application example of the electronic apparatus 1. The HMD 320 in FIG. 39A has an attachment member 322 for attachment so as to cover human eyes. The attachment member 322 is hooked and fixed to human ears, for example. A display device 321 is provided inside the HMD 320, and a wearer of the HMD 320 can visually recognize a stereoscopic image and the like with the display device 321. The HMD 320 has, for example, a wireless communication function and an acceleration sensor, and can switch stereoscopic images and the like displayed on the display device 321 according to a posture, a gesture, or the like of the wearer.

Furthermore, a camera may be provided in the HMD 320 to capture an image around the wearer, and display an image obtained by combining the image captured by the camera and an image generated by a computer on the display device 321. For example, a camera is disposed to overlap the rear surface side of the display device 321 visually recognized by the wearer of the HMD 320, the periphery of the eye of the wearer is imaged by the camera, and the captured image is displayed on another display provided on the outer surface of the HMD 320, so that a person around the wearer can ascertain a facial expression or movement of the eye of the wearer in real time.

Figure 39B:
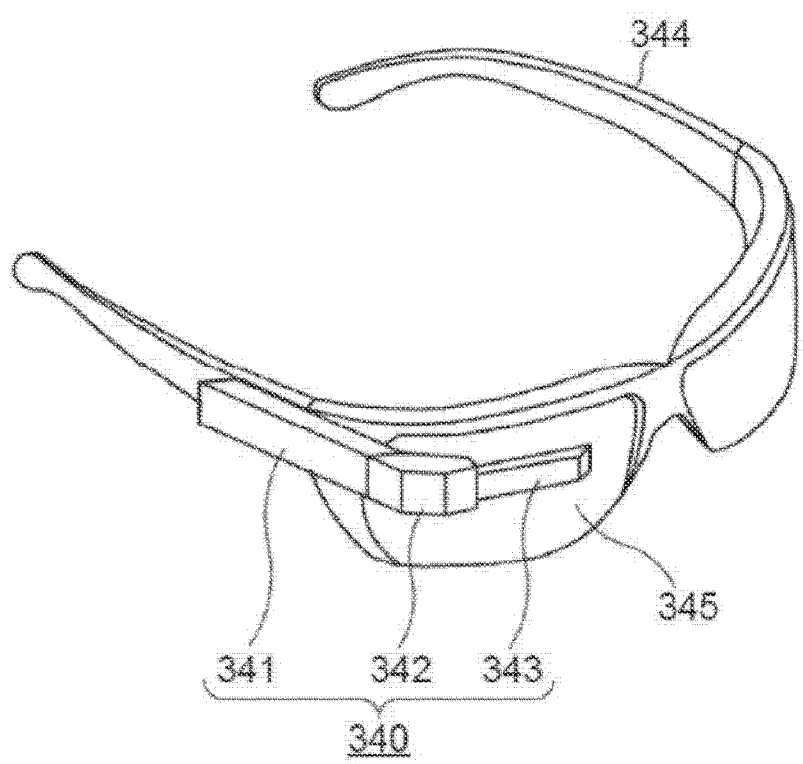
FIG. 39B is an external view of a smart glass.

Note that various types of the HMD 320 are conceivable. For example, as illustrated in FIG. 39B, the electronic apparatus 1 according to the present disclosure is also applicable to a smart glass 340 that display various types of information on glasses 344. The smart glasses 340 in FIG. 39B include a main body portion 341, an arm portion 342, and a lens barrel portion 343. The main body portion 341 is connected to the arm portion 342. The main body portion 341 is detachable from glasses 344. The main body portion 341 incorporates a control board and a display unit for controlling an operation of the smart glass 340. The main body portion 341 and the lens barrel are connected to each other via an arm portion 342. The lens barrel portion 343 emits image light that is emitted from the main body portion 341 through the arm portion 342 toward the lens 345 of the glasses 344. This image light enters a human eye through the lens 345. Similarly to normal glasses, a wearer of the smart glass 340 in FIG. 39B can visually recognize not only a surrounding situation but also various pieces of information emitted from the lens barrel portion 343.

Fourth Application Example

The electronic apparatus 1 according to the present disclosure is also applicable to a television apparatus (hereinafter, a TV). Recent TVs tend to make a frame as small as possible from the viewpoint of downsizing and design property. Thus, in a case where a camera that captures an image of a viewer is provided in a TV, it is desirable that the camera is disposed to overlap a rear surface side of a display panel 331 of the TV.

Figure 40:
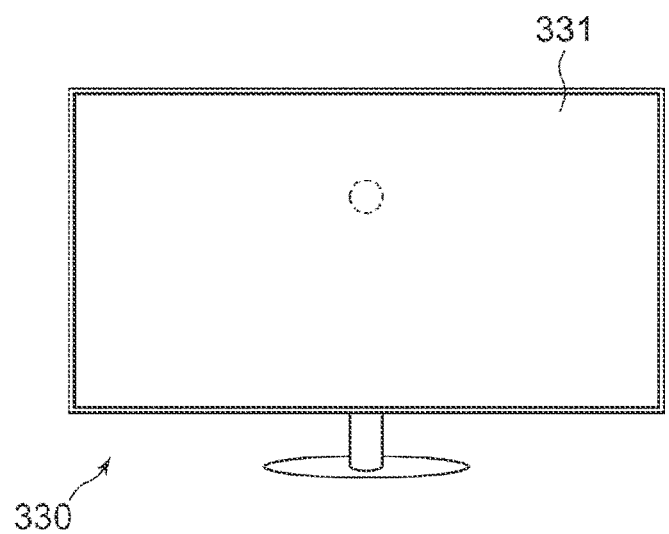
FIG. 40 is an external view of a TV that is a fourth application example of the electronic apparatus.

FIG. 40 is an external view of a TV 330 as a fourth application example of the electronic apparatus 1. In the TV 330 in FIG. 40, a frame thereof is minimized, and almost the entire region on the front side is a display region. The TV 330 incorporates a sensor such as a camera for capturing an image of a viewer. The sensor in FIG. 40 is disposed on a rear side of a part (for example, a dashed line part) in the display panel 331. The sensor may be an image sensor module, or various sensors such as a sensor for face authentication, a sensor for distance measurement, and a temperature sensor may be used, and a plurality of types of sensors may be disposed on the rear surface side of the display panel 331 of the TV 330.

As described above, according to the electronic apparatus 1 of the present disclosure, since the image sensor module can be disposed to overlap the rear surface side of the display panel 331, it is not necessary to dispose a camera or the like in a frame, the TV 330 can be downsized, and there is no possibility that the design is impaired by the frame.

Fifth Application Example

Figure 41:
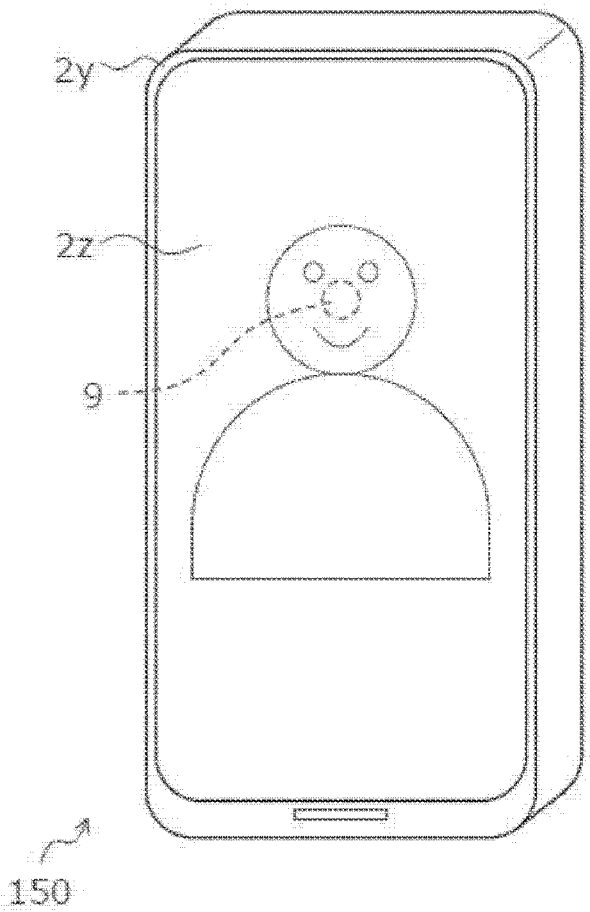
FIG. 41 is an external view of a smartphone that is a fifth application example of the electronic apparatus.

The electronic apparatus 1 according to the present disclosure is also applicable to a smartphone or a mobile phone. FIG. 41 is an external view of a smartphone 350 as a fifth application example of the electronic apparatus 1. In the example in FIG. 41, a display surface 2z spreads close to an outer size of the electronic apparatus 1, and a width of a bezel 2y around the display surface 2z is set to several mm or less. Normally, a front camera is often mounted on the bezel 2y, but in FIG. 41, as indicated by a dashed line, an image sensor module 9 functioning as a front camera is disposed on a rear surface side of the substantially central portion of the display surface 2z, for example. By providing the front camera on the rear surface side of the display surface 2z as described above, it is not necessary to dispose the front camera in the bezel 2y, and the width of the bezel 2y can be reduced.

The embodiments described above may have the following forms.

(1)

An imaging element including:

a plurality of pixels that acquires first information that is information of three primary colors and second information that is information of at least two colors different from the three primary colors and that includes at least one of complementary colors of the three primary colors.

(2)

The imaging element according to (1), in which the three primary colors are red (R), green (G), and blue (B), and the complementary colors are cyan (Cy), yellow (Ye), and magenta (Mg).

(3)

The imaging element according to (2), in which the second information includes Cy information and Ye information.

(4)

The imaging element according to (2), in which the second information includes Cy information, Ye information, and Mg information.

(5)

The imaging element according to any one of (1) to (4), in which the second information includes at least one of white information or emerald information.

(6)

The imaging element according to any one of (1) to (5), in which the pixels output information of at least two colors of the first information and the second information.

(7)

The imaging element according to (6), in which the pixels include a plurality of divided pixels, and acquire information of one color of the first information and the second information for each of the divided pixels.

(8)

The imaging element according to (7), in which pieces of information of similar colors among pieces of information of colors included in the first information and the second information are collectively acquired.

(9)

The imaging element according to (8), in which the pieces of information of similar colors include information of at least one of R and Mg, B and Cy, G and Ye, R and Ye, or R and infrared light.

(10)

The imaging element according to (1), in which the first information and the second information are information acquired by different light receiving elements at the same timing.

(11)

The imaging element according to (10), in which the second information includes at least one of pieces of information of the three primary colors.

(12)

The imaging element according to (10) or (11), in which the first information and the second information are acquired at different resolutions.

(13)

The imaging element according to any one of (1) to (12), in which at least one of the pixels acquires information by using an organic photoelectric conversion film.

(14)

The imaging element according to (13), in which the first information is acquired in an organic photoelectric conversion film, and the second information is acquired in a photodiode via the organic photoelectric conversion film, or the second information is acquired in an organic photoelectric conversion film, and the first information is acquired in a photodiode via the organic photoelectric conversion film.

(15)

An electronic apparatus including:

the imaging element according to any one of (1) to (14), in which the electronic apparatus has a still image mode and a moving image mode, and combines the first information and the second information at different timings or in different blocks in the still image mode and the moving image mode.

(16)

The imaging element according to any one of (1) to (15), in which at least one of the pixels acquires information of light in an infrared region.

(17)

The imaging element according to (16), in which a filter capable of removing infrared rays is provided in at least a part of an imaging element included in the pixel that acquires the information of light in the infrared region.

(18)

The imaging element according to any one of (1) to (17), in which frame images output from the pixels are combined, and the number of pixels to be added for each frame is controlled at a combining timing.

(19)
An electronic apparatus including:
the imaging element according to any one of (1) to (18), in which
the electronic apparatus performs object identification, living body identification, or light source estimation on the basis of spectrum information acquired from the imaging element.

(20)
The electronic apparatus according to (19), in which
image processing or a parameter for the image processing is controlled on the basis of a target identified through the object identification or the living body identification.

(21)
An electronic apparatus including:
a display that displays an image; and
the imaging element according to any one of (1) to (18) provided at a position overlapping the display.

(22)
An electronic apparatus including:
a compound-eye camera including at least one of the imaging elements according to any one of (1) to (18), in which
at least one of the imaging elements does not include an infrared ray cut filter.

(23)
The imaging element according to any one of (1) to (18), further including:
a first pixel group that acquires the first information; and
a second pixel group that acquires the second information, in which
the second pixel group includes a pixel having a sensitivity higher than a sensitivity of a pixel that acquires G information in the first pixel group.

(24)
The imaging element according to (23), in which
the second pixel group includes at least pixels that acquire white information.

(25)
The imaging element according to (23) or (24), in which
information acquired by the second pixel group is interpolated by using information acquired by the first pixel group.

(26)
The imaging element according to any one of (23) to (25), in which
the imaging element has in a still image mode in which a still image is acquired and a moving image mode in which a moving image is acquired, and
the first pixel group and the second pixel group are combined according to different methods in the still image mode and the moving image mode.

(27)
The imaging element according to (26), in which
the first pixel group and the second pixel group are combined at different timings in the still image mode and the moving image mode.

(28)
The imaging element according to (26) or (27), in which
the first pixel group and the second pixel group are combined in different system blocks in the still image mode and the moving image mode.

(29)
The imaging element according to any one of (23) to (28), in which
a resolution of a pixel belonging to the first pixel group is set to be lower than a resolution of a pixel belonging to the second pixel group in the moving image mode.

(30)
The imaging element according to any one of (23) to (29), in which
color information acquired from the second pixel group is corrected on the basis of a color information statistical value or a light source estimation result acquired from the first pixel group.

(31)
The imaging element according to any one of (23) to (30), in which
a pixel belonging to the first pixel group and a closest pixel among pixels belonging to the second pixel group are disposed to be separated by a distance of 10 mm or less.

(32)
The imaging element according to (31), in which
the closest pixel is disposed to be separated by a distance of 50 mm to 80 mm.

(33)
The imaging element according to any one of (23) to (32), in which
either the first pixel group or the second pixel group includes divided pixels into which a pixel belonging to the first pixel group or the second pixel group are divided.

(34)
The imaging element according to (33), in which
the divided pixels include a white pixel.

(35)
The imaging element according to any one of (23) to (34), in which
for light acquired in the first pixel group and the second pixel group, optical parameters serving as paths of the light have different parameters in the respective groups.

(36)
The imaging element according to any one of (23) to (35), in which
the second pixel group includes a pixel having a sensitivity higher than a sensitivity of a pixel that acquires B information in the first pixel group.

(37)
The imaging element according to (36), in which
the pixel having the sensitivity higher than the sensitivity of the pixel that acquires the B information is a pixel that acquires white or cyan information.

(38)
The imaging element according to any one of (1) to (37), in which
for pixel information acquired in five or more colors, the information of the three primary colors is recalculated through arithmetic processing from the acquired image information, and rearranged information is output.

(39)
The imaging element according to (38), in which,
a pixel value or a statistical value of information including at least complementary color information is calculated from the acquired image information.

(40)
The imaging element according to (39), in which
the statistical value of the information of the three primary colors and the complementary color information is calculated from the acquired image information.

(41)

The imaging element according to (39), in which the statistical value is calculated from the complementary color information on the basis of the acquired image information without including the information of the three primary colors.

(42)

The imaging element according to any one of (1) to (41), in which respective exposure amounts of pixels receiving light of the three primary colors and pixels receiving light of the complementary colors are controlled.

(43)

The imaging element according to (41), in which the exposure amount is controlled by controlling a shutter time.

(44)

The imaging element according to (42) or (43), in which the exposure amount is controlled by controlling a gain.

(45)

A solid-state imaging device including: the imaging element according to any one of (1) to (44).

(46)

An electronic apparatus including:
an imaging element including a plurality of pixels that acquires first information that is information of three primary colors and second information that is information of at least two colors different from the three primary colors and that includes at least one of complementary colors of the three primary colors.

Aspects of the present disclosure are not limited to the above-described embodiments, but include various conceivable modifications, and the effects of the present disclosure are not limited to the above-described contents. The constituents in each embodiment may be appropriately combined and applied. That is, various additions, modifications, and partial deletions can be made without departing from the conceptual idea and gist of the present disclosure derived from the contents defined in the claims and equivalents thereof.

REFERENCE SIGNS LIST

1 Electronic apparatus
10 Solid-state imaging device
100 Light receiving unit
102 Storage unit
104 Control unit
106 Signal processing unit
108 Image processing unit
110 Lens
112 IRCF
114 Imaging element,
120 A/D converter
122 Clamp unit
124 Linear matrix unit
126 Gamma correction unit
130 Light source estimation unit
132 Object recognition unit
134 Image memory unit
136 Binocular combining unit
140 Luminance chroma signal generation unit
150 Input/output I/F
160 Pre-linear matrix unit
162 RGB rearrangement unit
164 Sensor output unit
166 Statistical value acquisition unit
20 Pixel
200 Light receiving element
202 Filter
204 Pixel array
206 Organic photoelectric conversion film
208 Photodiode
210 On-chip lens
30 Board
32 First board
34 Second board
300 Pixel region
302 Control circuit
304 Logic circuit

The invention claimed is:

1. An imaging element comprising:
a plurality of pixels that acquires first information that is information of three primary colors and second information that is information of at least two colors different from the three primary colors and that includes at least one of complementary colors of the three primary colors,
wherein the plurality of pixels include a plurality of divided pixels that are divided in a predetermined direction, each divided region of a divided pixel having a respective light receiving element,
information of one color of the first information and one color the second information is acquired for each of the divided pixels,
only pieces of information of similar colors having a common wavelength component included in the first information and the second information are collectively associated for each divided pixel,
the three primary colors include red (R), green (G), and blue (B), and the complementary colors include cyan (Cy), yellow (Ye), and magenta (Mg), and
the second information includes Cy information, Ye information, and Mg information.

2. The imaging element according to claim 1, wherein the second information includes at least one of white information, emerald information, or infrared light information.

3. The imaging element according to claim 2, wherein a filter capable of removing infrared rays is provided in at least a part of an imaging element included in a pixel that acquires information of light in an infrared region.

4. The imaging element according to claim 1, wherein the pieces of information of similar colors include information of at least one of R and Mg, B and Cy, G and Ye, R and Ye, or R and infrared light.

5. The imaging element according to claim 1, wherein the first information and the second information are acquired at different resolutions.

6. The imaging element according to claim 1, wherein at least one of the pixels acquires information by using an organic photoelectric conversion film.

7. The imaging element according to claim 6, wherein the first information is acquired in an organic photoelectric conversion film, and the second information is acquired in a photodiode via the organic photoelectric conversion film, or the second information is acquired in an organic photoelectric conversion film, and the first information is acquired in a photodiode via the organic photoelectric conversion film.

8. An electronic apparatus comprising:
the imaging element according to claim 1, and
an electronic processor configured to operate in one of a still image mode and a moving image mode, and combine the first information and the second information at different timings or in different blocks in the still image mode and the moving image mode.

9. An electronic apparatus comprising:

the imaging element according to claim 1, and an electronic processor configured to execute object identification, living body identification, or light source estimation on a basis of spectrum information acquired from the imaging element.

10. The electronic apparatus according to claim 9, wherein image processing or a parameter related to the image processing is controlled on a basis of a target identified through the object identification or the living body identification.

11. An electronic apparatus comprising the imaging element according to claim 1, and an electronic processor configured to recalculate, for image information acquired in five or more colors, the information of the three primary colors through arithmetic processing from the acquired image information and output rearranged information.

12. The imaging element according to claim 11, wherein information including at least a complementary color is output by one of a pixel value or a statistical value in addition to image data rearranged to the three primary colors.

13. The imaging element according to claim 1, wherein respective exposure amounts of pixels receiving the three primary colors and pixels receiving the complementary colors are controlled.

14. An electronic apparatus comprising:

a display that displays an image; and the imaging element according to claim 1 provided at a position overlapping the display.

15. An electronic apparatus comprising:

an imaging element including a plurality of pixels that acquires first information that is information of three primary colors and second information that is information of at least two colors different from the three primary colors and that includes at least one of complementary colors of the three primary colors, wherein the plurality of pixels include a plurality of divided pixels that are divided in a predetermined direction, each divided region of a divided pixel having a respective light receiving element, information of one color of the first information and one color the second information is acquired for each of the divided pixels, only pieces of information of similar colors having a common wavelength component included in the first information and the second information are collectively associated for each divided pixel, the three primary colors include red (R), green (G), and blue (B), and the complementary colors include cyan (Cy), yellow (Ye), and magenta (Mg), and the second information includes Cy information, Ye information, and Mg information.

* * * * *